United States Patent
Kim et al.

(10) Patent No.: US 11,581,234 B2
(45) Date of Patent: Feb. 14, 2023

(54) SEMICONDUCTOR PACKAGE WITH IMPROVED HEAT DISSIPATION

(71) Applicant: Samsung Electronics Co., Ltd., Suwon-si (KR)

(72) Inventors: Younglyong Kim, Anyang-si (KR); Myungkee Chung, Hwaseong-si (KR); Aenee Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 79 days.

(21) Appl. No.: 16/888,990

(22) Filed: Jun. 1, 2020

(65) Prior Publication Data
US 2020/0388549 A1  Dec. 10, 2020

(30) Foreign Application Priority Data
Jun. 7, 2019 (KR) .......... 10-2019-0067575

(51) Int. Cl.
*H01L 23/367* (2006.01)
*H01L 25/065* (2006.01)
*H01L 23/31* (2006.01)

(52) U.S. Cl.
CPC ........ *H01L 23/367* (2013.01); *H01L 23/3128* (2013.01); *H01L 25/0652* (2013.01)

(58) Field of Classification Search
CPC .............. H01L 23/367; H01L 25/0652; H01L 2225/06589; H01L 2225/06548; H01L 2225/06541; H01L 2924/181
See application file for complete search history.

(56) References Cited

U.S. PATENT DOCUMENTS

| | | | |
|---|---|---|---|
| 5,904,497 A * | 5/1999 | Akram | H01L 23/16 438/106 |
| 6,566,166 B2 | 5/2003 | Chien | |
| 7,049,695 B1 | 5/2006 | Pogge | |
| 7,462,920 B2 | 12/2008 | Tang et al. | |
| 7,629,684 B2 | 12/2009 | Alcoe et al. | |
| 7,649,249 B2 | 1/2010 | Noguchi | |
| 7,906,842 B2 | 3/2011 | Park | |

(Continued)

FOREIGN PATENT DOCUMENTS

KR   101238212 B1   2/2013
WO   WO-2012133098 A1   10/2012

*Primary Examiner* — Allen L Parker
*Assistant Examiner* — Gustavo G Ramallo
(74) *Attorney, Agent, or Firm* — Harness, Dickey & Pierce, P.L.C.

(57) ABSTRACT

A semiconductor package including a semiconductor chip, an interposer on the semiconductor chip, and a molding layer covering at least a portion of the semiconductor chip and at least a portion of the interposer may be provided. The interposer includes a interposer substrate and a heat dissipation pattern penetrating the interposer substrate and electrically insulated from the semiconductor chip. The heat dissipation pattern includes a through electrode disposed in the interposer substrate and an upper pad disposed on an upper surface of the interposer substrate and connected to the through electrode. The molding layer covers at least a portion of a sidewall of the upper pad and the upper surface of the interposer substrate. At least a portion of an upper surface of the upper pad is not covered by the molding layer.

19 Claims, 26 Drawing Sheets

(56) References Cited

U.S. PATENT DOCUMENTS

| | | |
|---|---|---|
| 7,913,387 B2 | 3/2011 | Chu et al. |
| 8,354,663 B2 | 1/2013 | Adivarahan et al. |
| 9,059,144 B2 | 6/2015 | Higgins, III et al. |
| 9,137,926 B2 | 9/2015 | Yamaguchi et al. |
| 9,318,411 B2* | 4/2016 | Lin ........................ H01L 23/36 |
| 9,460,983 B2 | 10/2016 | Horiuchi et al. |
| 9,653,373 B2* | 5/2017 | Kim .................. H01L 23/49816 |
| 9,711,485 B1 | 7/2017 | Berry et al. |
| 9,953,956 B2* | 4/2018 | Lee ....................... H01L 33/502 |
| 11,063,018 B2* | 7/2021 | Kinsley .................. H01L 23/36 |
| 2008/0116580 A1* | 5/2008 | Jiang .................... H01L 21/561 |
| | | 257/766 |
| 2011/0084612 A1 | 4/2011 | Ratcliffe et al. |
| 2017/0200667 A1 | 7/2017 | John et al. |
| 2018/0240729 A1 | 8/2018 | Kim et al. |
| 2019/0074264 A1* | 3/2019 | Chen .................. H01L 25/0657 |
| 2019/0237406 A1* | 8/2019 | Choi ...................... H01L 25/16 |

* cited by examiner

SEMICONDUCTOR PACKAGE WITH IMPROVED HEAT DISSIPATION

CROSS-REFERENCE TO RELATED APPLICATION

This application claims priority under 35 U.S.C. § 119 to Korean Patent Application No. 10-2019-0067575, filed on Jun. 7, 2019, in the Korean Intellectual Property Office, the disclosure of which is hereby incorporated by reference in its entirety.

TECHNICAL FIELD

Example embodiments of the present disclosure relate to semiconductor packages and/or methods of manufacturing the same, and, more specifically, to semiconductor packages having an improved heat dissipation property and methods of manufacturing the same.

DISCUSSION OF RELATED ART

In general, a packaging process is performed on semiconductor chips formed by performing various semiconductor processes on a wafer. Recently, various types of semiconductor chips are packaged in a single package, and the semiconductor chips are electrically connected to each other to operate as a single system. However, during operation of the semiconductor chips, excessive heat is generated. The semiconductor package may be degraded due to the excessive heat.

SUMMARY

According to an example embodiment of the inventive concepts, a semiconductor package includes a first semiconductor chip, a first interposer on the first semiconductor chip, the first interposer including a first interposer substrate and a first heat dissipation pattern passing through the first interposer substrate and electrically insulated from the first semiconductor chip, and a molding layer covering at least a portion of the first semiconductor chip and at least a portion of the first interposer. The first heat dissipation pattern may include a first through electrode passing through the first interposer substrate, and a first upper pad on an upper surface of the first interposer substrate and connected to the first through electrode. The molding layer may cover at least a portion of a sidewall of the first upper pad and at least a portion of the upper surface of the first interposer substrate. At least a portion of an upper surface of the first upper pad may be not covered by the molding layer.

According to an example embodiment of the inventive concepts, a semiconductor package includes a first semiconductor chip, a second semiconductor chip on the first semiconductor chip, a first interposer on the first semiconductor chip, the first interposer including a first interposer substrate and a first heat dissipation pattern passing through the first interposer substrate, and a second interposer on the second semiconductor chip, the second interposer including a second interposer substrate and a second heat dissipation pattern passing through the second interposer substrate.

According to an example embodiment of the inventive concepts, a semiconductor package includes a first semiconductor chip, a second semiconductor chip on the first semiconductor chip, a third semiconductor chip on the first semiconductor chip, a first interposer on the first semiconductor chip, the first interposer including a first interposer substrate and a plurality of first heat dissipation patterns electrically insulated from the first semiconductor chip, a second interposer on the second semiconductor chip, the second interposer including a second interposer substrate and a plurality of second heat dissipation patterns electrically insulated from the second semiconductor chip, a third interposer on the third semiconductor chip, the third interposer including a third interposer substrate and a plurality of third heat dissipation patterns electrically insulated from the third semiconductor chip, and a molding layer covering at least a portion of the first semiconductor chip, at least a portion of the first interposer, at least a portion of the second semiconductor chip, at least a portion of the second interposer, at least a portion of the third semiconductor chip, and at least a portion of the third interposer. Each of the plurality of first heat dissipation patterns may include a first through electrode passing through the first interposer substrate, and a first upper pad on an upper surface of the first interposer substrate and connected to the first through electrode. Each of the plurality of second heat dissipation patterns may include a second through electrode passing through the second interposer substrate, and a second upper pad on an upper surface of the second interposer substrate and connected to the second through electrode. Each of the plurality of third heat dissipation patterns may include a third through electrode passing through the third interposer substrate, and a third upper pad on an upper surface of the third interposer substrate and connected to the third through electrode.

According to an example embodiment of the inventive concepts, a method of manufacturing a semiconductor package includes preparing a first interposer including a first interposer substrate and a first heat dissipation pattern, the first heat dissipation pattern including a first through electrode passing through the first interposer substrate and a first upper pad on an upper surface of the first interposer substrate, stacking the first interposer on a first semiconductor chip, positioning a molding film on the first interposer to contact a portion of the first upper pad and to be spaced apart from the upper surface of the first interposer substrate, forming a molding layer covering the first interposer substrate while not covering the portion of the first upper pad that is in contact with the molding film, and removing the molding film.

DETAILED DESCRIPTION

Figure 1:
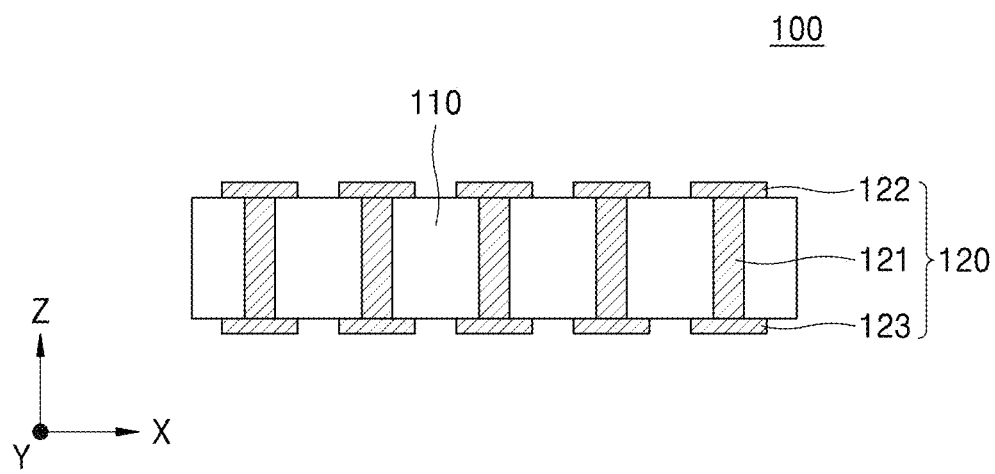
FIG. 1 is a cross-sectional view illustrating an interposer according to an example embodiment of the inventive concepts.

Various example embodiments will now be described more fully hereinafter with reference to the accompanying drawings. Like reference numerals may refer to like elements throughout this application.

FIG. 1 is a cross-sectional view illustrating an interposer according to an example embodiment of the inventive concepts.

Referring to FIG. 1, an interposer 100 may include an interposer substrate 110 and a heat dissipation pattern 120.

The interposer substrate 110 may include an organic material. For example, the interposer substrate 110 may be formed of prepreg that is a material in which resin is infiltrated into a glass fiber or a carbon fiber and is hardened to a B-stage (semi-curable state of resin). In some embodiments, the interposer substrate 110 may be a silicon wafer including silicon, such as single crystalline silicon, polycrystalline silicon, or amorphous silicon. In some embodiments, the interposer substrate 110 may include ceramic. The interposer substrate 110 may have a plate shape and may have an upper surface and a lower surface opposite to each other.

The heat dissipation pattern 120 may pass through the interposer substrate 110. That is, the heat dissipation pattern 120 may extend from the upper surface of the interposer substrate 110 to the lower surface of the interposer substrate 110. When the interposer 100 is attached to an object desiring heat dissipation, the heat dissipation pattern 120 may serve as a path for releasing heat to the outside. For example, when the interposer 100 is attached to the object desiring the heat dissipation, as a bottom of the heat dissipation pattern 120 contacts the object and a top of the heat dissipation pattern 120 is exposed to the outside, heat generated from the object may be released to the outside through the heat dissipation pattern 120.

The heat dissipation pattern 120 may include a material having high thermal conductivity. For example, the heat dissipation pattern 120 may include a material having a thermal conductivity of 10 W/mK or more. For example, the heat dissipation pattern 120 may include at least one of copper (Cu), nickel (Ni), gold (Au), tungsten (W), and aluminum (Al).

The heat dissipation pattern 120 may include a through electrode 121 penetrating the interposer substrate 110, an upper pad 122 on the upper surface of the interposer substrate 110, and a lower pad 123 on the lower surface of the interposer substrate 110. A top end of the through electrode 121 may be connected to the upper pad 122. A bottom end of the through electrode 121 may be connected to the lower pad 123. The upper pad 122 and the lower pad 123 may be thermally coupled by the through electrode 121. When the interposer 100 is attached to the object desiring the heat dissipation, at least a portion of the upper pad 122 may be exposed to the outside and the lower pad 123 may contact the object.

In some example embodiments, a width of the through electrode 121 in a horizontal direction (i.e., an X direction or a Y direction) may be between 50 μm and 500 μm. A height of the through electrode 121 in a vertical direction (i.e., a Z direction) may be between 50 μm and 300 μm.

In some example embodiments, a width of the upper pad 122 in the horizontal direction may be greater than the width of the through electrode 121 in the horizontal direction. In other words, a planar area of the upper pad 122 may be greater than a planar area of the through electrode 121, in an X-Y plane having the X direction and the Y direction. In this case, as a surface area of the upper pad 122 exposed to the outside increases, heat transfer from the upper pad 122 to the outside may be improved.

In some example embodiments, the width of the upper pad 122 in the horizontal direction may be greater than the width of the through electrode 121 in the horizontal direction by at least 10 μm. For example, difference between the width of the upper pad 122 and the width of the through electrode 121 may be between 10 μm and 70 μm.

In some example embodiments, a distance between adjacent upper pads 122 in the horizontal direction may be between 10 μm and 100 μm.

In some example embodiments, a height of the upper pad 122 in the vertical direction may be between 5 μm and 50 μm.

As shown in FIG. 1, one upper pad 122 may be connected to one through electrode 121. However, in some embodiments, one upper pad 122 may be connected to a plurality of through electrodes 121. For example, the upper pad 122 may have a plate shape covering at least a portion of the upper surface of the interposer substrate 110 and connected to the plurality of through electrodes 121.

In some example embodiments, a width of the lower pad 123 in the horizontal direction may be greater than the width of the through electrode 121 in the horizontal direction. That is, a planar area of the lower pad 123 may be greater than the planar area of the through electrode 121, in the X-Y plane. In this case, because a contact area of the lower pad 123 contacting the object desiring the heat dissipation increases, the heat transfer between the object and the lower pad 123 may be improved.

In some example embodiments, the width of the lower pad 123 in the horizontal direction may be greater than the width of the through electrode 121 in the horizontal direction by at least 10 μm. For example, difference between the width of the lower pad 123 and the width of the through electrode 121 may be between 10 μm and 70 μm.

In some example embodiments, a distance between adjacent lower pads 123 in the horizontal direction may be between 10 μm and 100 μm.

In some example embodiments, a height of the lower pad 123 in the vertical direction may be between 5 μm and 50 μm.

As shown in FIG. 1, one lower pad 123 may be connected to one through electrode 121. However, in some example embodiments, one lower pad 123 may be connected to a plurality of through electrodes 121. For example, the lower pad 123 may have a plate shape covering at least a portion of the lower surface of the interposer substrate 110 and connected to the plurality of through electrodes 121.

Figure 2A:
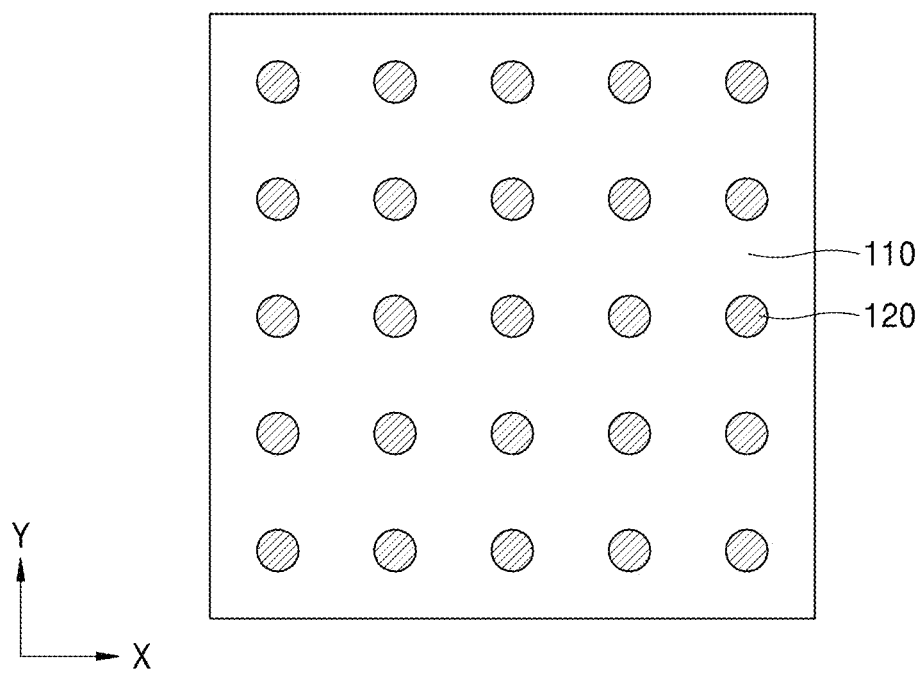
FIGS. 2A and 2B are plan views illustrating arrangements of heat dissipation patterns in the interposer of FIG. 1 according to some example embodiments of the inventive concepts.
Figure 2B:
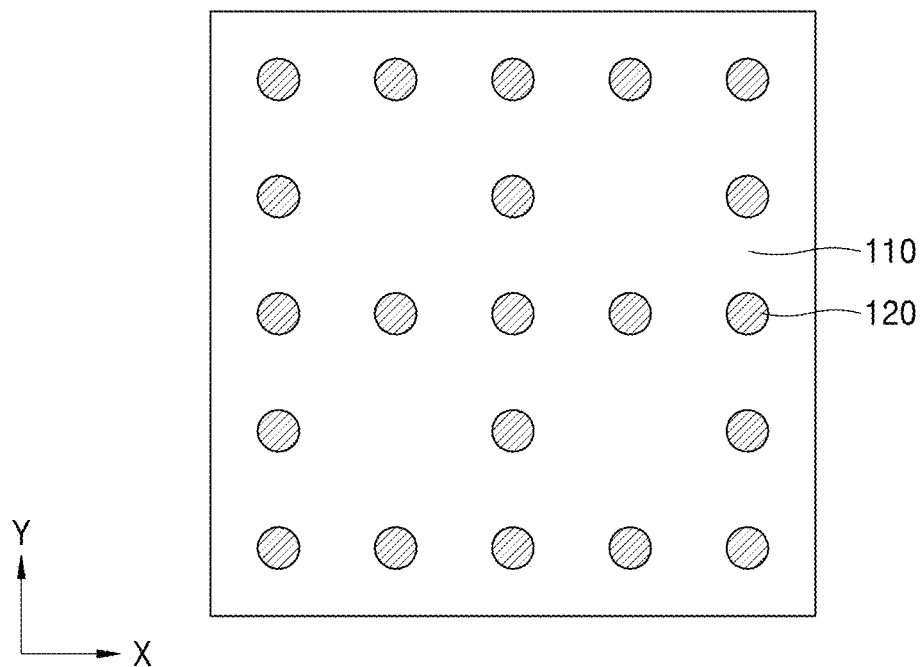

FIGS. 2A and 2B are plan views illustrating arrangements of heat dissipation patterns in the interposer of FIG. 1 according to some example embodiments of the inventive concepts.

In FIG. 2A, a first arrangement of heat dissipation patterns 120 is shown. In FIG. 2B, a second arrangement of the heat dissipation patterns 120 is shown. The first arrangement of the heat dissipation patterns 120 may represent a case in which the number or a density of the heat dissipation patterns 120 is relatively large, and the second arrangement of the heat dissipation patterns 120 may represent a case in which the number or density of heat dissipation patterns 120 is relatively small. Here, the arrangement of the heat dissipation patterns 120 may mean the number, density, or array form of the heat dissipation patterns 120.

Because the heat dissipation property of the interposer 100 is changed depending on the number or density of the heat dissipation patterns 120, the arrangement of the heat dissipation patterns 120 may be changed according to the object desiring the heat dissipation.

For example, when the interposer 100 is used to release heat of a semiconductor chip, the arrangement of the heat dissipation patterns 120 may be changed depending on a type of the semiconductor chip. For example, when a heat generation amount of the semiconductor chip is relatively great or the semiconductor chip desires rapid heat dissipation in the case in which the semiconductor chip is vulnerable to heat, the number or density of the heat dissipation patterns 120 may be increased.

Further, the arrangement of the heat dissipation patterns 120 may vary from region to region of the interposer 100. For example, the number or density of the heat dissipation patterns 120 in a first region of the interposer 100 may be larger than the number or density of the heat dissipation patterns 120 in a second region of the interposer 100. For example, when the first region of the interposer 100 corresponds to a central region of the semiconductor chip at which the heat generation amount is relatively large and the second region of the interposer 100 corresponds to a peripheral region of the semiconductor chip at which the heat generation amount is relatively small, the number or density of the heat dissipation patterns 120 in the first region of the interposer 100 may be larger than that of the heat dissipation patterns 120 in the second region of the interposer 100.

Figure 3:
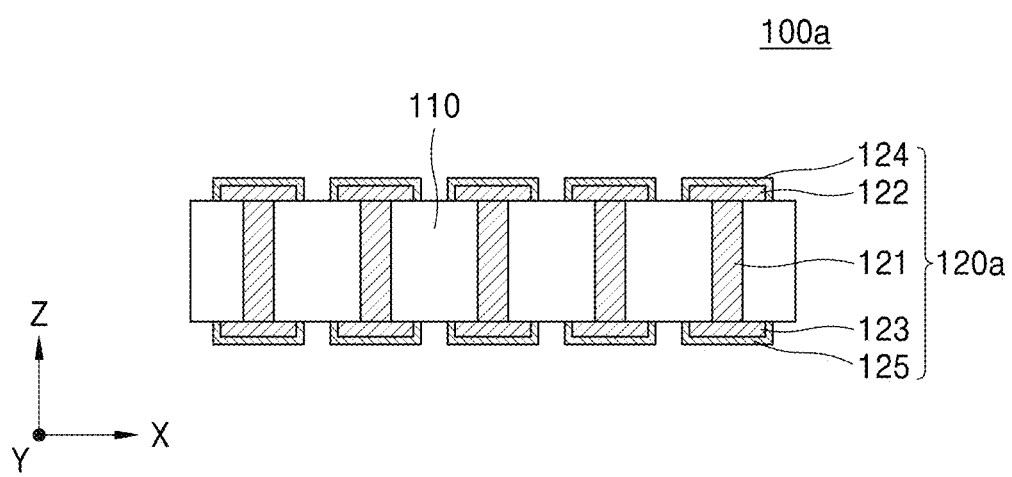
FIG. 3 is a cross-sectional view illustrating an interposer according to an example embodiment of the inventive concepts.

FIG. 3 is a cross-sectional view illustrating an interposer according to an example embodiment of the inventive concepts. An interposer of FIG. 3 may be the same as or substantially similar to the interposer 100 shown in FIG. 1 except further including an upper cover layer and a lower cover layer.

Referring to FIG. 3, a heat dissipation pattern 120a of an interposer 100a may include an upper cover layer 124 on the upper pad 122 and a lower cover layer 125 on the lower pad 123.

The upper cover layer 124 may cover the upper pad 122 on the upper surface of the interposer substrate 110. The upper cover layer 124 may serve as a oxidation barrier layer for preventing oxidation of the upper pad 122. The upper cover layer 124 may include, for example, nickel (Ni) and/or gold (Au). For example, the upper cover layer 124 may be formed by a plating process.

The lower cover layer 125 may cover the lower pad 123 on the lower surface of the interposer substrate 110. The lower cover layer 125 may serve as a oxidation barrier layer for preventing oxidation of the lower pad 123. The lower cover layer 125 may include, for example, nickel (Ni) and/or gold (Au). For example, the lower cover layer 125 may be formed by a plating process.

Figure 4:
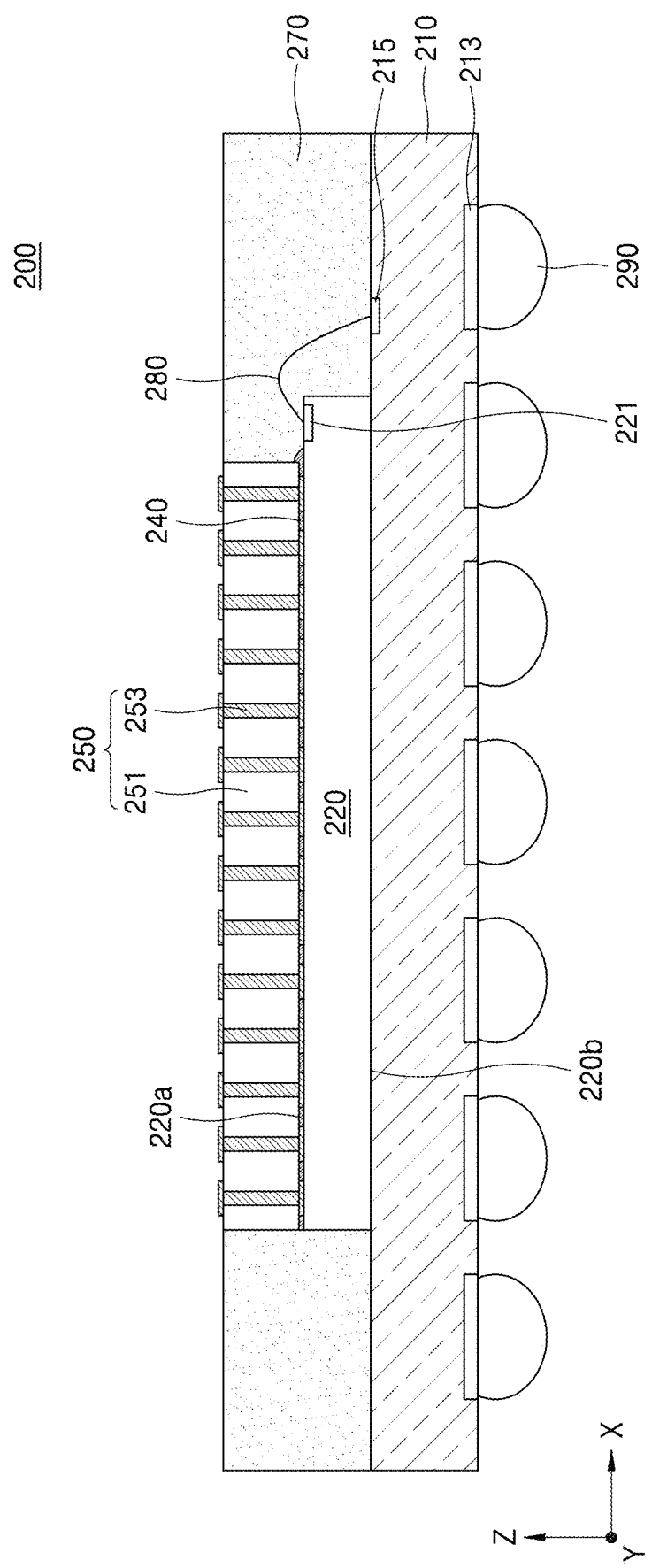
FIG. 4 is a cross-sectional view illustrating a semiconductor package according to an example embodiment of the inventive concepts.
Figure 5:
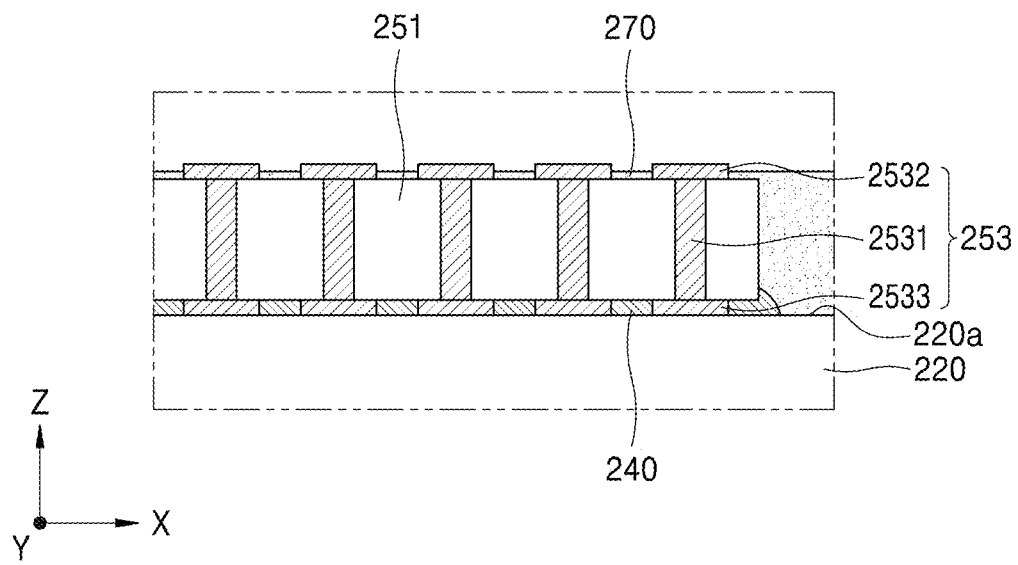
FIG. 5 is an enlarged cross-sectional view of a portion of the semiconductor package of FIG. 4.

FIG. 4 is a cross-sectional view illustrating a semiconductor package according to an example embodiment of the inventive concepts. FIG. 5 is an enlarged cross-sectional view of a portion of the semiconductor package of FIG. 4.

Referring to FIGS. 4 and 5, a semiconductor package 200 may include a package substrate 210, a first semiconductor chip 220, a first interposer 250, and a molding layer 270.

The package substrate 210 may be, for example, a printed circuit board. The package substrate 210 may include a substrate base made of at least one of phenol resin, epoxy resin, and polyimide. The package substrate 210 may include an upper substrate pad 215 and a lower substrate pad 213 on an upper surface and a lower surface, respectively, of the substrate base. The upper substrate pad 215 and the lower substrate pad 213 may include, for example, copper (Cu), nickel (Ni), and/or aluminum (Al). An internal wiring line may be disposed in the substrate base to connect the upper substrate pad 215 and the lower substrate pad 213.

An external connection terminal 290 may be attached to a lower surface of the package substrate 210. For example, the external connection terminal 290 may be attached to the lower substrate pad 213. The external connection terminal 290 may be, for example, a solder ball or a bump. The external connection terminal 290 may electrically connect the semiconductor package 200 and an external device.

The first semiconductor chip 220 may be mounted on the package substrate 210. The first semiconductor chip 220 may include a semiconductor substrate having opposite active and inactive surfaces and a semiconductor device layer on the active surface of the semiconductor substrate. The first semiconductor chip 220 may have opposite first and second surfaces 220a and 220b. A first chip pad 221 may be disposed on the first surface 220a of the first semiconductor chip 220. The first chip pad 221 may be electrically connected to the semiconductor device layer through a wiring structure.

The first semiconductor chip 220 may be a memory chip, for example, a volatile memory chip and/or a nonvolatile memory chip. The volatile memory chip may include, for example, dynamic random access memory (DRAM), static RAM (SRAM), thyristor RAM (TRAM), zero capacitor RAM (ZRAM), or twin transistor RAM (TTRAM). The nonvolatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

The first semiconductor chip 220 may be a non-memory chip. For example, the first semiconductor chip 220 may be a logic chip, such as an artificial intelligence semiconductor chip, microprocessor, graphic processor, signal processor, network processor, chipset, audio codec, video codec, application processor, or system on chip, but the inventive concepts are not limited thereto.

The first semiconductor chip 220 may be mounted on the package substrate 210 so that the first surface 220a of the first semiconductor chip 220 on which the first chip pad 221 is disposed faces upward. The first chip pad 221 may be arranged along a side of a first semiconductor chip 220. The first chip pad 221 may be electrically connected to the upper substrate pad 215 of the package substrate 210 through a conductive wire 280. The first chip pad 221 may be used as a terminal to transfer input/output data signals of the first semiconductor chip 220 or a terminal to provide power and/or ground for the first semiconductor chip 220.

The first interposer 250 may be stacked on the first surface 220a of the first semiconductor chip 220. The first interposer 250 may include a first interposer substrate 251 and a first heat dissipation pattern 253. The first heat dissipation pattern 253 may include a first through electrode 2531, a first upper pad 2532, and a first lower pad 2533. The first interposer 250 may include the interposer 100 or the interposer 100a described with reference to FIGS. 1 to 3.

The first heat dissipation pattern 253 may be used as a heat transfer path for releasing the heat of the first semiconductor chip 220 to the outside. For example, a bottom of the first heat dissipation pattern 253 may contact the first surface 220a of the first semiconductor chip 220, and a top of the first heat dissipation pattern 253 may be exposed to the outside. In this case, the heat of the first semiconductor chip 220 may be emitted to the outside through the first heat dissipation pattern 253. The first heat dissipation pattern 253 may be electrically insulated from the first semiconductor chip 220. The first heat dissipation pattern 253 of the first interposer 250 may be spaced apart from and electrically insulated from the first chip pad 221 of the first semiconductor chip 220.

In some example embodiments, a first thermal interface material (TIM) 240 may be interposed between the first interposer 250 and the first semiconductor chip 220. The first TIM 240 may physically fix the first interposer 250 to the first semiconductor chip 220 and may strengthen thermal coupling between the first heat dissipation pattern 253 of the first interposer 250 and the first semiconductor chip 220. For example, the first TIM 240 may be formed of an insulating material, for example, an insulating material capable of maintaining an electrical insulation.

The first interposer 250 may be stacked on the first semiconductor chip 220 not to overlap the first chip pad 221 of the first semiconductor chip 220. For example, in the case in which a plurality of first chip pad 221 are disposed adjacent to a side edge of the first surface 220a of the first semiconductor chip 220, the first interposer 250 may be spaced a desired (or alternatively, predetermined) distance apart from the side edge of the first surface 220a of the first semiconductor chip 220 so as not to cover the plurality of first chip pads 221.

The molding layer 270 may cover at least a portion of the first semiconductor chip 220 and at least a portion of the first interposer 250. Thus, the molding layer 270 may act to protect the first semiconductor chip 220 and the first interposer 250 from the external environment.

The molding layer 270 may be formed by injecting an appropriate amount of a molding material around the first semiconductor chip 220 and curing the molding material. The molding layer 270 may be a portion for forming an appearance of the semiconductor package 200. In some example embodiments, the molding material for forming the molding layer 270 may include epoxy-group molding resin or polyimide-group molding resin. For example, the molding layer 270 may include an epoxy molding compound (EMC).

As shown in FIG. 5, the molding layer 270 may cover a portion of the first upper pad 2532 and the first interposer substrate 251 and may expose the other portion of the first upper pad 2532 to the outside. For example, the molding layer 270 may cover a portion of a sidewall of the first upper pad 2532, and may expose an upper surface of the first upper pad 2532. In this case, the molding layer 270 may protect the portion of the sidewall of the first upper pad 2532.

The first TIM 240 may be interposed between a lower surface of the first interposer substrate 251 and the first semiconductor chip 220. The first TIM 240 may fill a space between the lower surface of the first interposer substrate 251 and the first semiconductor chip 220, and may cover the first lower pad 2533 on the lower surface of the first interposer substrate 251. For example, the first TIM 240 may fill a space between adjacent first lower pads 2533, and may cover at least a portion of the first lower pad 2533. Although not specifically illustrated, according to some example embodiments, the first TIM 240 may further cover a lower surface of the first lower pad 2533 facing the first surface 220a of the first semiconductor chip 220.

In some example embodiments, because the heat generated from the first semiconductor chip 220 is released using the first interposer 250 attached onto the first semiconductor chip 220, the heat generation property of the semiconductor package 200 may be improved.

Figure 6:
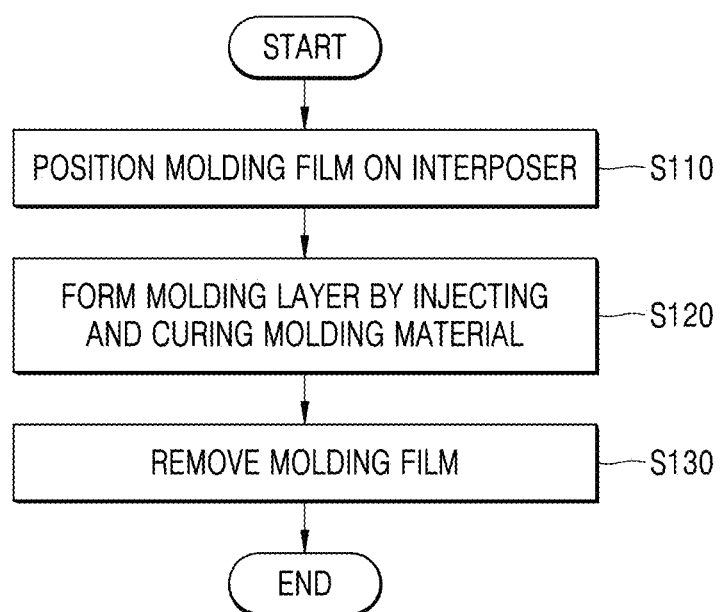
FIG. 6 is a flow chart illustrating a method of forming a molding layer of the semiconductor package of FIG. 4 according to an example embodiment of the inventive concepts.
Figure 7A:
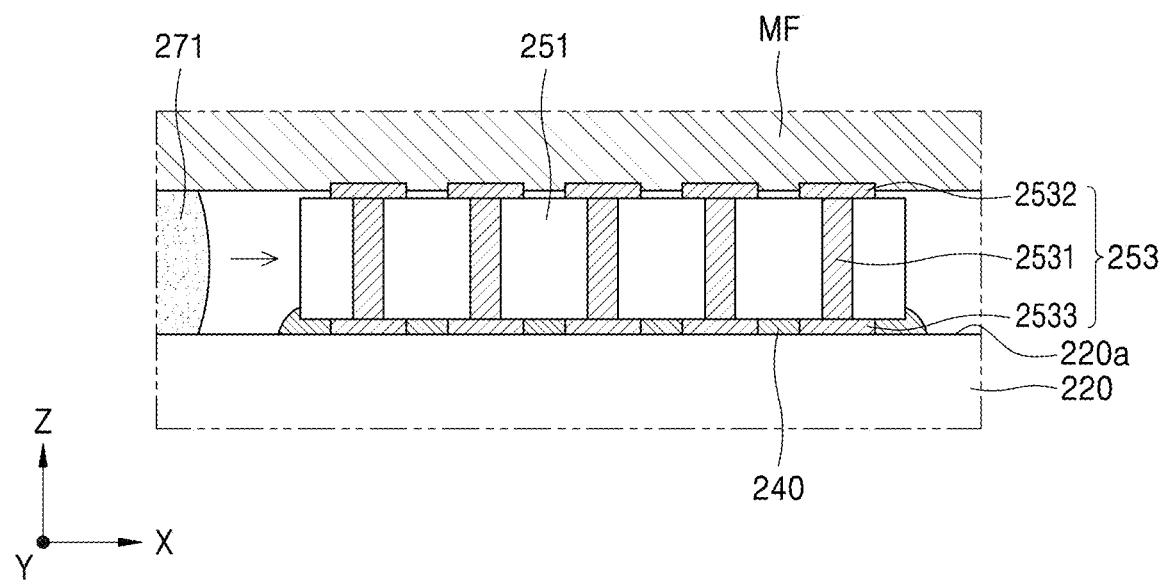
FIGS. 7A and 7B are cross-sectional views illustrating methods of forming a molding layer of the semiconductor package of FIG. 4 according to some example embodiments of the inventive concepts.
Figure 7B:
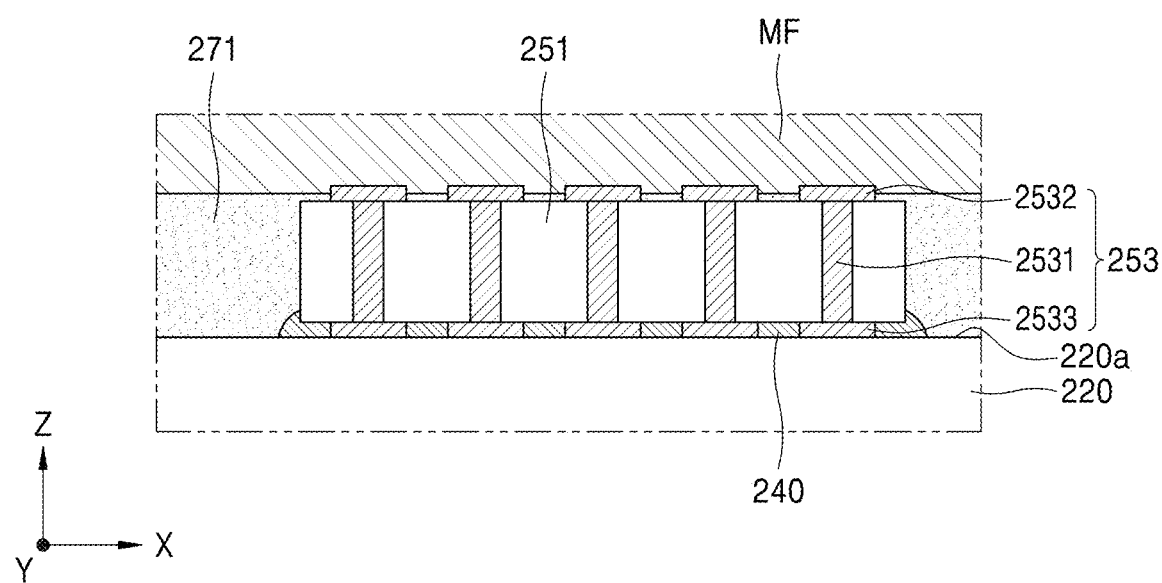

FIG. 6 is a flow chart illustrating a method of forming a molding layer of the semiconductor package of FIG. 4 according to an example embodiment of the inventive concepts. FIGS. 7A and 7B are cross-sectional views illustrating methods of forming a molding layer of the semiconductor package of FIG. 4 according to some example embodiments of the inventive concepts.

Referring to FIGS. 4, 6, 7A, and 7B, to form the molding layer 270 of the semiconductor package 200, step S110 of positioning a molding film MF on the first interposer 250, step S120 of forming the molding layer 270 by injecting and curing the molding material 271, and step S130 of removing the molding film MF may be sequentially performed.

For example, in the step S110 of positioning the molding film MF on the first interposer 250, the molding film MF may cover (contact) a portion of a surface of the first upper pad 2532, and may not cover (not contact) at least a portion of a sidewall of the first upper pad 2532. The molding film MF may be spaced apart from an upper surface of the first interposer substrate 251 to a desired (or alternatively, predetermined) distance to form a space between the upper surface of the first interposer substrate 251 and the molding film MF.

In the step S120 of forming the molding layer 270 by injecting and curing the molding material 271, the molding material 271 may be provided below the molding film MF and may be formed to cover the first semiconductor chip 220 and the first interposer substrate 251. The molding material 271 may fill the space between the molding film MF and the first interposer substrate 251. At that time, the molding material 271 may not cover a portion of the first upper pad 2532 covered by (in contact with) the molding film MF. When a certain pressure and heat are applied to the molding material 271 so as to cure the molding material 271, the molding layer 270 may be formed to cover at least a portion of the first upper pad 2532.

For example, as shown in FIG. 7A, the molding layer 270 may be formed by a transfer molding method using the molding film MF. In some example embodiments, as shown in FIG. 7B, the molding layer 270 may be formed by a compression molding method using the molding film MF.

After the molding layer 270 is formed, the molding film MF may be removed (S130). The molding film MF may be, for example, a release film. Because the molding film MF is removed, a portion of the first upper pad 2532 may be covered by the molding layer 270, whereas the other portion of the first upper pad 2532 may be exposed to the outside.

Figure 8:
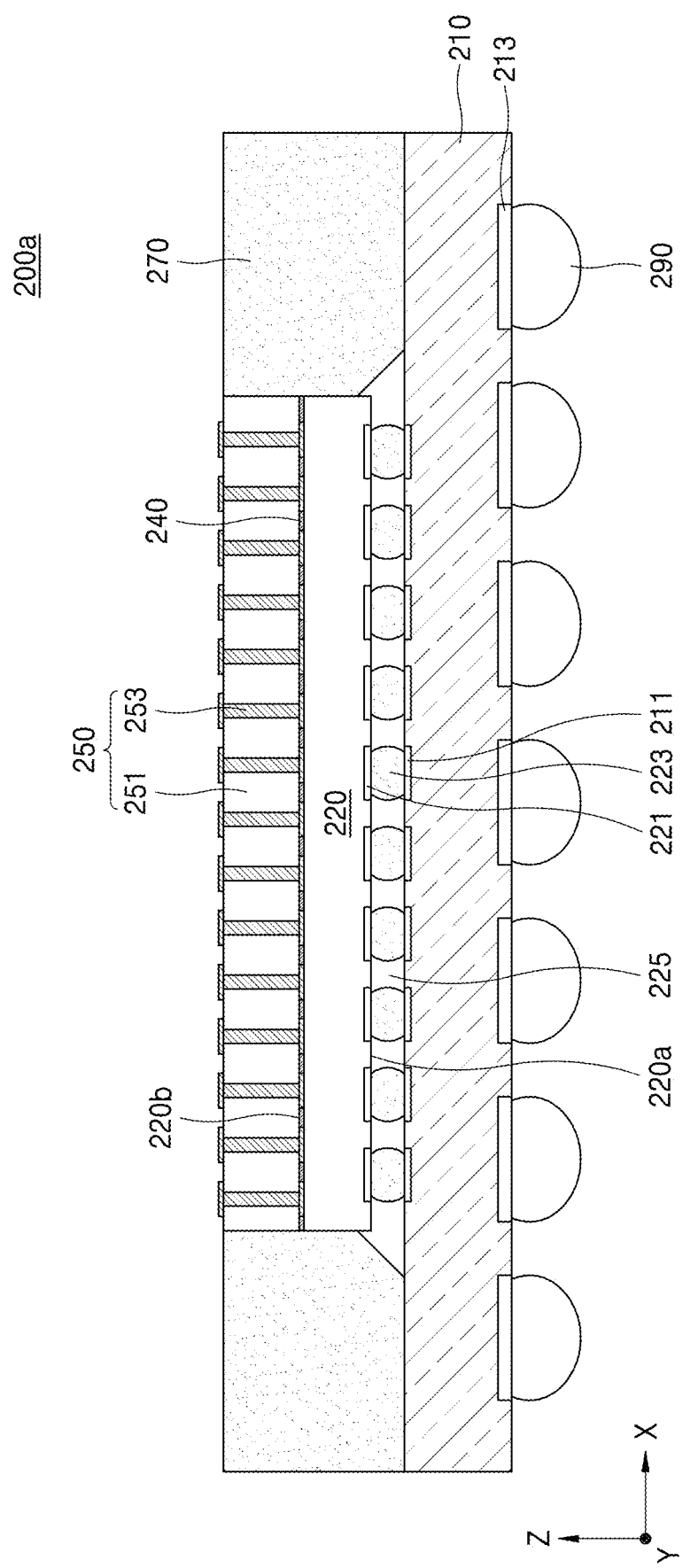
FIG. 8 is a cross-sectional view illustrating a semiconductor package according to an example embodiment of the inventive concepts.

FIG. 8 is a cross-sectional views illustrating a semiconductor package according to an example embodiment of the inventive concepts. A semiconductor package shown in FIG. 8 may be the same as or substantially similar to the semiconductor package 200 shown in FIG. 4 except that the first semiconductor chip is mounted on the package substrate by a flip-chip bonding method.

Referring to FIG. 8, a semiconductor package 200a may include the package substrate 210, the first semiconductor chip 220, the first interposer 250, and the molding layer 270. The first semiconductor chip 220 may be mounted on the package substrate 210 so that the first surface 220a of the first semiconductor chip 220 on which the first chip pad 221 is disposed faces toward an upper surface of the package substrate 210. The first chip pad 221 of the first semiconductor chip 220 may be electrically connected to the upper substrate pad 211 of the package substrate 210 through a connection part 223.

The first interposer 250 may be mounted on the second surface 220b of the first semiconductor chip 220. Because the first interposer 250 is mounted on the second surface 220b of the first semiconductor chip 220 on which the first chip pad 221 of the first semiconductor chip 220 is not disposed, the first interposer 250 may cover the whole second surface 220b of the first semiconductor chip 220.

An underfill material layer 225 may fill a space between the first semiconductor chip 220 and the package substrate 210, and may cover the connection part 223. For example, the underfill material layer 225 may include epoxy resin and may be formed by a capillary under-fill method. In some example embodiments, the underfill material layer 225 may be a non-conductive film. In some example embodiments, the molding layer 270 may directly fill the space between the first semiconductor chip 220 and the package substrate 210. In this case, the underfill material layer 225 may be omitted.

Figure 9:
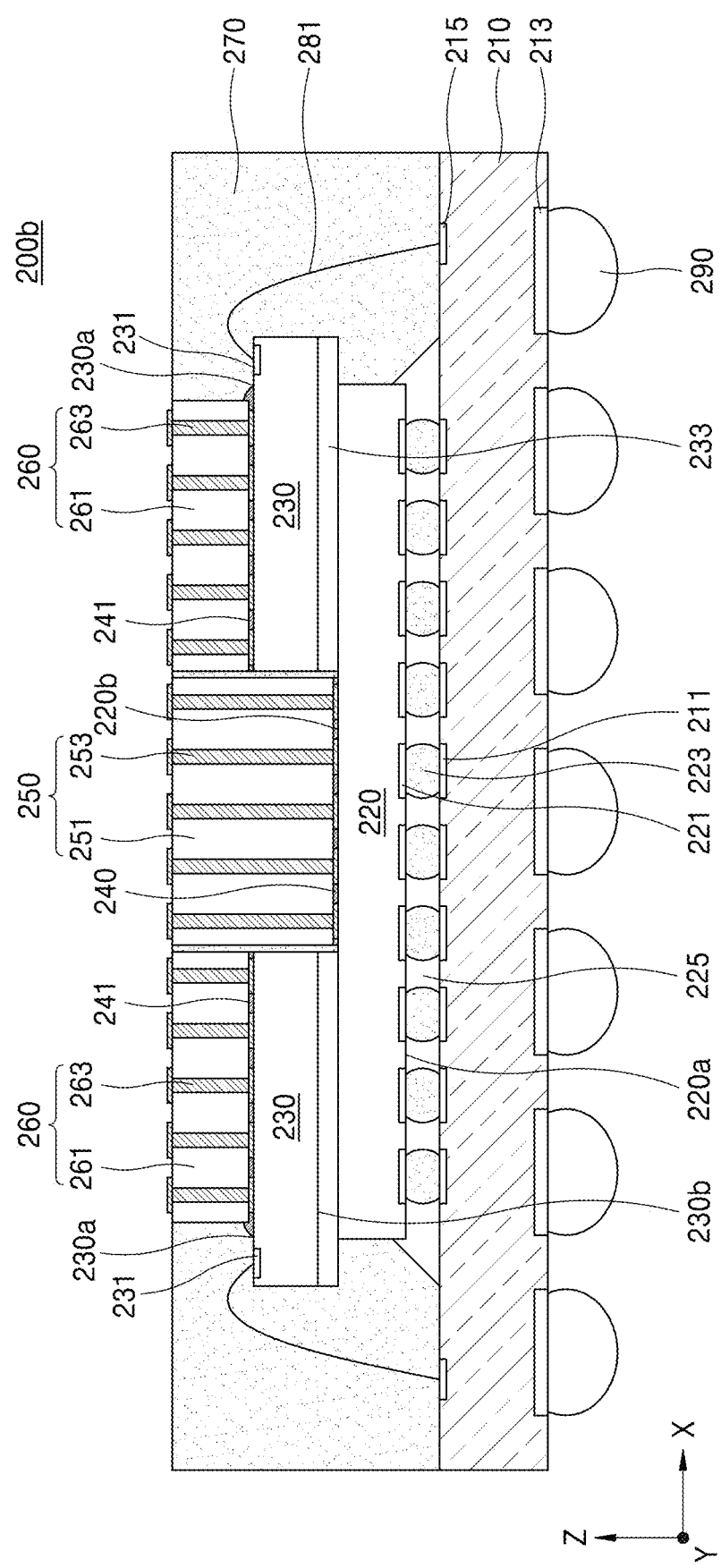
FIG. 9 is a cross-sectional view illustrating a semiconductor package according to an example embodiment of the inventive concepts.

FIG. 9 is a cross-sectional views illustrating a semiconductor package according to an example embodiment of the inventive concepts. A semiconductor package shown in FIG. 9 may be the same as or substantially similar to the semiconductor package 200a shown in FIG. 8 except further including a second semiconductor chip on the first semiconductor chip and a second interposer on the second semiconductor chip.

Referring to FIG. 9, a semiconductor package 200b may include the package substrate 210, the first semiconductor chip 220 on the package substrate 210, a second semiconductor chip 230 stacked on the first semiconductor chip 220, the first interposer 250 on the first semiconductor chip 220, a second interposer 260 on the second semiconductor chip 230, and the molding layer 270.

The second semiconductor chip 230 may be stacked in an offset relation on the first semiconductor chip 220. That is, a portion of the second semiconductor chip 230 protrudes from the first semiconductor chip 220 in the horizontal direction (e.g., the X direction and/or the Y direction). The second semiconductor chip 230 may be stacked on the first semiconductor chip 220 so that a first surface 230a of the second semiconductor chip 230 on which a second chip pad 231 is disposed faces upward and a second surface 230b of the second semiconductor chip 230 opposite to the first surface 230a thereof faces toward the first semiconductor chip 220. An adhesive layer 233 may be provided between the second semiconductor chip 230 and the first semiconductor chip 220 to attach the second semiconductor chip 230.

The second chip pad 231 of the second semiconductor chip 230 may be arranged along a side of the second semiconductor chip 230. The second chip pad 231 may be electrically connected to the upper substrate pad 215 of the package substrate 210 through a conductive wire 281.

In some example embodiments, the first semiconductor chip 220 and the second semiconductor chip 230 may be different types of semiconductor chips. For example, when the first semiconductor chip 220 is a non-memory chip, the second semiconductor chip 230 may be a memory chip. In some example embodiments, the first semiconductor chip 220 and the second semiconductor chip 230 may be the same type of semiconductor chips. In some example embodiments, the semiconductor package 200b may be a system in package in which different types of semiconductor chips are electrically connected to each other to operate as one system.

The first interposer 250 may be disposed on the first semiconductor chip 220. The first interposer 250 may include the first interposer substrate 251 and the first heat dissipation pattern 253. The first interposer 250 may include the interposers 100 and 100a described with reference to FIGS. 1 to 3.

A bottom of the first heat dissipation pattern 253 may contact the first semiconductor chip 220, and a top of the first heat dissipation pattern 253 may be exposed to the outside. The first heat dissipation pattern 253 may be electrically insulated from the first semiconductor chip 220, and may include a material having a high thermal conductivity such that the first heat dissipation pattern 253 may be used to release the heat of the first semiconductor chip 220 to the outside. The first TIM 240 may be interposed between the first interposer 250 and the first semiconductor chip 220 to strengthen thermal coupling between the first heat dissipation pattern 253 and the first semiconductor chip 220.

The second interposer 260 may be disposed on the second semiconductor chip 230. The second interposer 260 may include a second interposer substrate 261 and a second heat dissipation pattern 263. The second heat dissipation pattern 263 may include a second through electrode penetrating the second interposer substrate 261, an upper pad on an upper surface of the second interposer substrate 261, and a lower pad on a lower surface of the second interposer substrate 261, similar to the first through electrode 2531, the first upper pad 2532, and the first lower pad 2533 of the first heat dissipation pattern 253 shown in FIG. 5. A top of the second heat dissipation pattern 263 may not be covered by or may protrude above the second interposer substrate 261. The second interposer 260 may include the interposers 100 and 100a described with reference to FIGS. 1 to 3.

A bottom of the second heat dissipation pattern 263 may contact the second semiconductor chip 230, and a top of the second heat dissipation pattern 263 may be exposed to the outside. The second heat dissipation pattern 263 may be electrically insulated from the second semiconductor chip 230 and may be include a material having a high thermal conductivity, such that the second heat dissipation pattern 263 may be used to release heat of the second semiconductor chip 230 to the outside. A second TIM 241 may be interposed between the second interposer 260 and the second semiconductor chip 230 to strengthen thermal coupling between the second heat dissipation pattern 263 and the second semiconductor chip 230.

The second interposer 260 may be stacked on the second semiconductor chip 230 not to overlap the second chip pad 231 of the second semiconductor chip 230. For example, when a plurality of second chip pads 231 of the second semiconductor chip 230 are disposed adjacent to a side edge of the first surface 230a of the second semiconductor chip 230, the second interposer 260 may be spaced apart from the side edge of the first surface 230a of the second semiconductor chip 230 by a desired (or alternatively, predetermined) distance not to cover the plurality of second chip pads 231 of the second semiconductor chip 230.

Figure 10A:
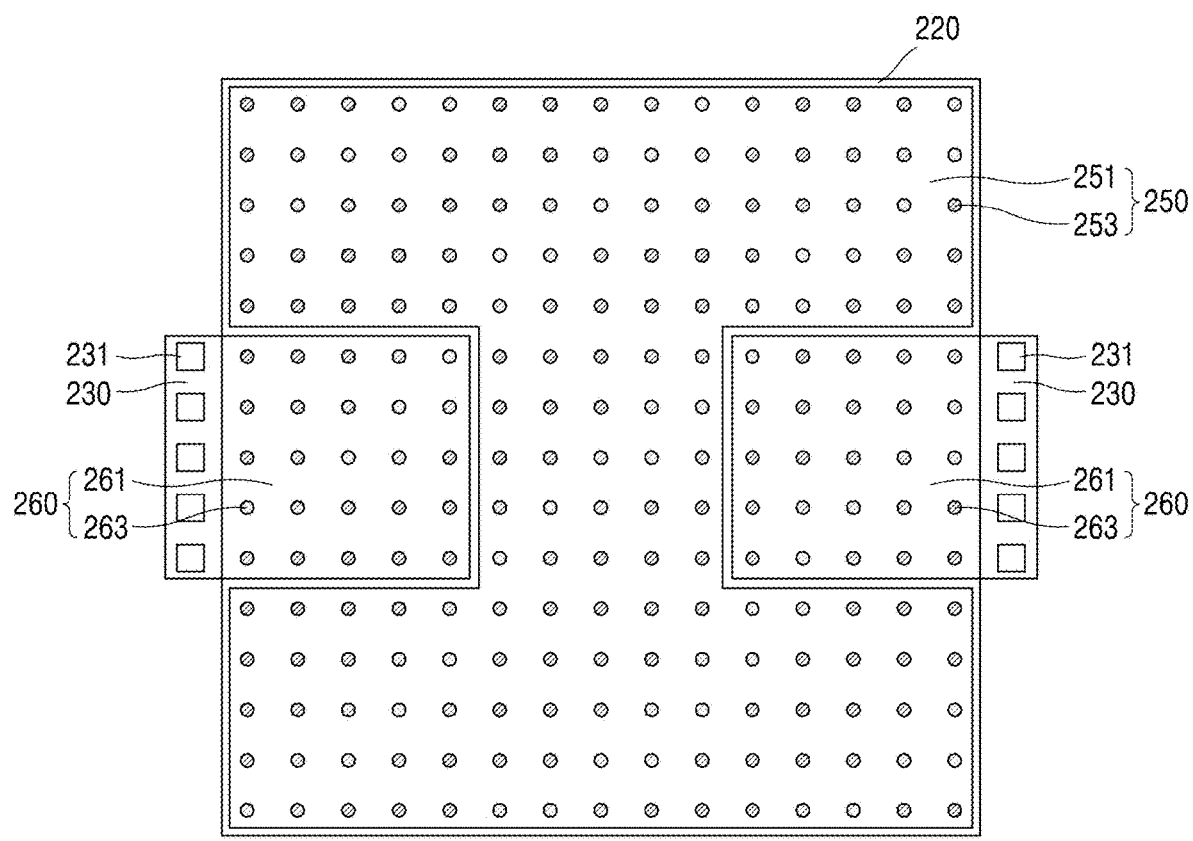
FIGS. 10A, 10B, and 10C are plan views illustrating a first interposer and a second interposer of the semiconductor package of FIG. 9 according to some example embodiments of the inventive concepts.
Figure 10B:
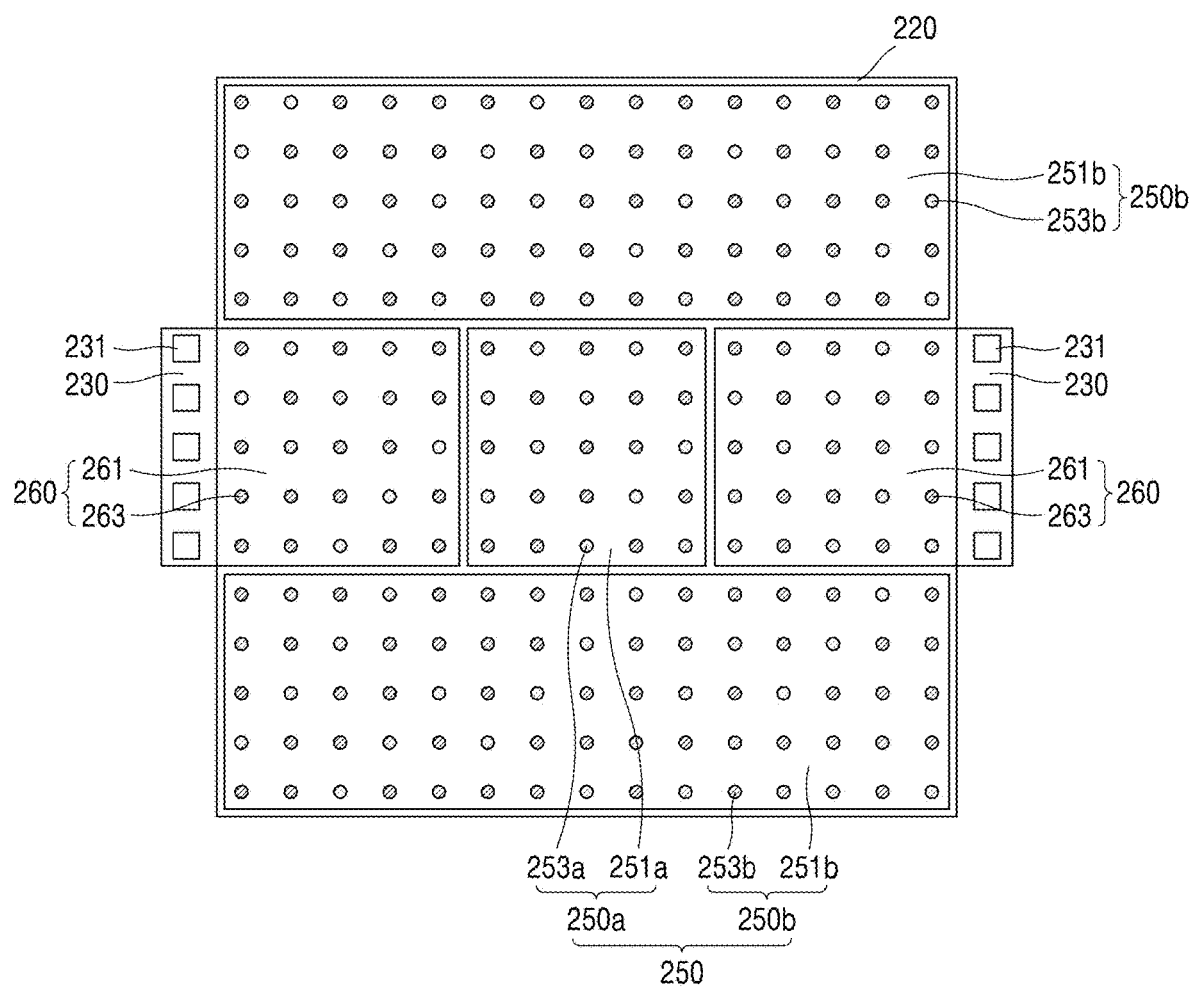
Figure 10C:
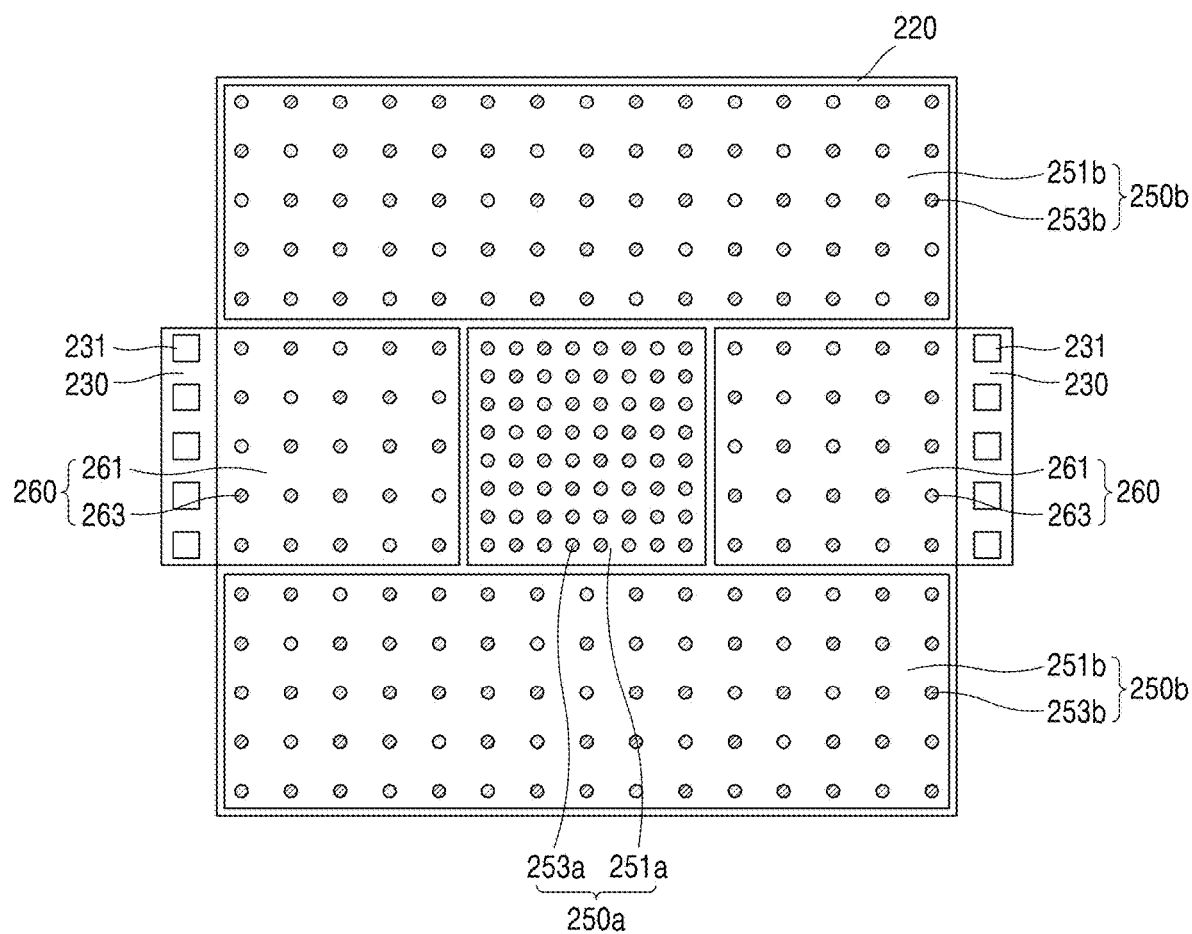

FIGS. 10A, 10B, and 10C are plan views illustrating a first interposer and a second interposer of the semiconductor package of FIG. 9 according to some example embodiments of the inventive concepts.

Referring to FIGS. 9 and 10A, two second semiconductor chips 230 may be stacked on the first semiconductor chip 220. The second interposer 260 may be stacked on each of the two second semiconductor chips 230. The two second semiconductor chips 230 may be spaced apart from each other with the first interposer 250 therebetween. In this case, the first interposer 250 may cover the remainder of the second surface 220b of the first semiconductor chip 220 other than a portion of the second surface 220b of the first semiconductor chip 220 on which the second semiconductor chip 230 is disposed.

The first interposer 250 may include a protruded portion (e.g., a downwardly protruded portion along the Z direction) to at least partially surround sidewalls of the second semiconductor chip 230. For example, when the second chip pad 231 of the second semiconductor chip 230 is disposed adjacent to a first sidewall of the second semiconductor chip 230, the first interposer 250 may surround second, third, and fourth sidewalls of the second semiconductor chip 230.

Referring to FIGS. 9 and 10B, the first interposer 250 may include a plurality of sections disposed on the first semiconductor chip 220. For example, the first interposer 250 may include a first sub interposer 250a on a central region of the second surface 220b of the first semiconductor chip 220 and two second sub interposers 250b on an edge region of the second surface 220b of the first semiconductor chip 220. The first sub interposer 250a may include a first sub interposer substrate 251a and a first sub heat dissipation pattern 253a. Each of the second sub interposers 250b may include a second sub interposer substrate 251b and a second sub heat dissipation pattern 253b.

The first sub interposer 250a and the second sub interposers 250b may at least partially surround sidewalls of the second semiconductor chip 230. For example, when the second chip pad 231 of the second semiconductor chip 230 is disposed adjacent to a first sidewall of the second semiconductor chip 230, the first sub interposer 250a may be disposed to face a second sidewall of the second semiconductor chip 230 that is opposite to the first sidewall of the second semiconductor chip 230, and the second sub interposers 250b may disposed to face opposite third and fourth sidewalls, respectively, of the second semiconductor chip 230. The third and fourth sidewalls of the second semiconductor chip 230 may be perpendicular to the first and second sidewalls of the second semiconductor chip 230.

Referring to FIGS. 9 and 10C, a density of a plurality of first sub heat dissipation patterns 253a included in the first sub interposer 250a may be different from a density of a plurality of second heat dissipation patterns 263 included in the second interposer 260. For example, when the heat generation amount of the first semiconductor chip 220 is larger than the heat generation amount of the second semiconductor chip 230, the density of the plurality of first sub heat dissipation patterns 253a included in the first sub interposer 250a may increase to improve the heat dissipation of the first semiconductor chip 220.

In some example embodiments, the density of the first heat dissipation patterns 253 (e.g., 253a and 253b) of the first interposer 250 may be vary from region to region. For example, the density of the plurality of first sub heat dissipation patterns 253a of the first sub interposer 250a may be larger than the density of the plurality of second sub heat dissipation patterns 253b of each of the second sub interposers 250b.

FIGS. 11, 12, 13, 14, and 15 are cross-sectional views illustrating semiconductor packages according to some example embodiments of the inventive concepts. Description of the same contents as described above are briefly made or omitted, for convenience of explanation.

Figure 11:
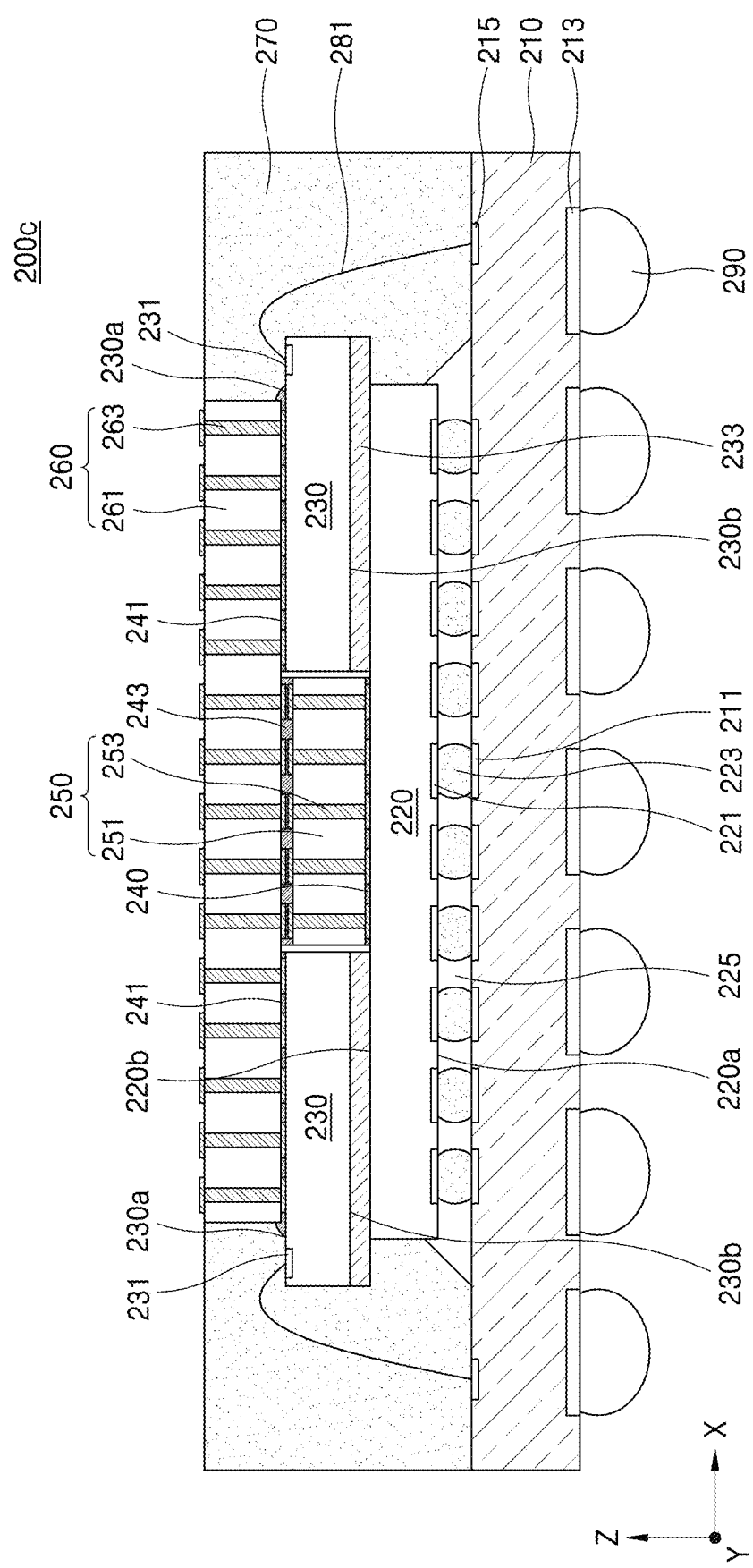
FIGS. 11, 12, 13, 14, and 15 are cross-sectional views illustrating semiconductor packages according to some example embodiments of the inventive concepts.

Referring to FIG. 11, a semiconductor package 200c may be substantially the same as or substantially similar to the semiconductor package 200b shown in FIG. 9 except that the first interposer 250 and the second interposer 260 are stacked in the vertical direction (e.g., the Z direction).

For example, the semiconductor package 200c may include the first interposer 250 on the first semiconductor chip 220 and the second interposer 260 on the second semiconductor chip 230. The first interposer 250 and the second interposer 260 may be stacked in the vertical direction. The second interposer 260 may cover the first surface 230a of the second semiconductor chip 230 and an upper surface of the first interposer 250.

In this case, the second heat dissipation pattern 263 of the second interposer 260 may be aligned with the first heat dissipation pattern 253 of the first interposer 250 in the vertical direction. Thus, the heat of the first semiconductor chip 220 may be released to the outside through the first heat dissipation pattern 253 and the second heat dissipation pattern 263. Further, a third TIM 243 may be interposed between the first interposer 250 and the second interposer 260 to strengthen thermal coupling between the first heat dissipation pattern 253 and the second heat dissipation pattern 263.

Figure 12:
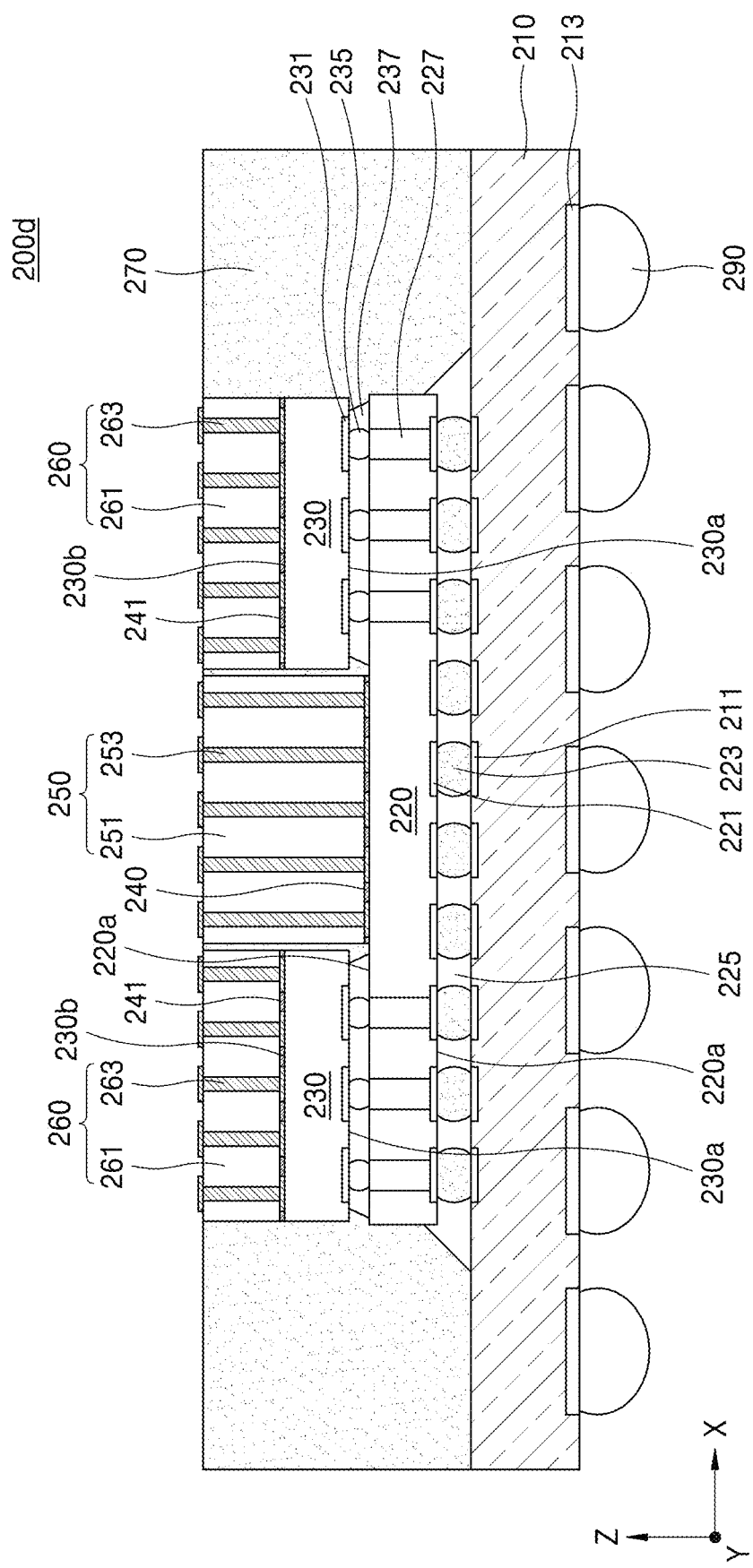

Referring to FIG. 12, a semiconductor package 200d may be substantially the same as or substantially similar to the semiconductor package 200b shown in FIG. 9 except that the second semiconductor chip 230 is mounted on the first semiconductor chip 220 by a flip chip bonding method.

For example, the second semiconductor chip 230 may be mounted on the first semiconductor chip 220 through an inter-chip connection 235 and a through silicon via (TSV) 227 in the first semiconductor chip 220. Further, the second semiconductor chip 230 may be electrically connected to the package substrate 210 through the inter-chip connection 235 and the TSV 227 of the first semiconductor chip 220. An underfill material layer 237 may fill a space between the second semiconductor chip 230, and the first semiconductor chip 220 and may enclose the inter-chip connection 235.

The second semiconductor chip 230 may be disposed so that the first surface 230a of the second semiconductor chip 230 on which the second chip pad 231 is disposed faces the first semiconductor chip 220. The second interposer 260 may be disposed on the second surface 230b of the second semiconductor chip 230. Because the second chip pad 231 is not disposed on the second surface 230b of the second semiconductor chip 230 on which the second interposer 260 is disposed, the second interposer 260 may cover the whole second surface 230b of the second semiconductor chip 230. A bottom of the first heat dissipation pattern 253 included in the first interposer 250 may contact the first semiconductor chip 220. A top of the first heat dissipation pattern 253 included in the first interposer 250 may not be covered by or may protrude above the first interposer substrate 251. A bottom of the second heat dissipation pattern 263 included in the second interposer 260 may contact the second semiconductor chip 230. A top of the second heat dissipation pattern 263 included in the second interposer 260 may not be covered by or may protrude above the second interposer substrate 261.

Figure 13:
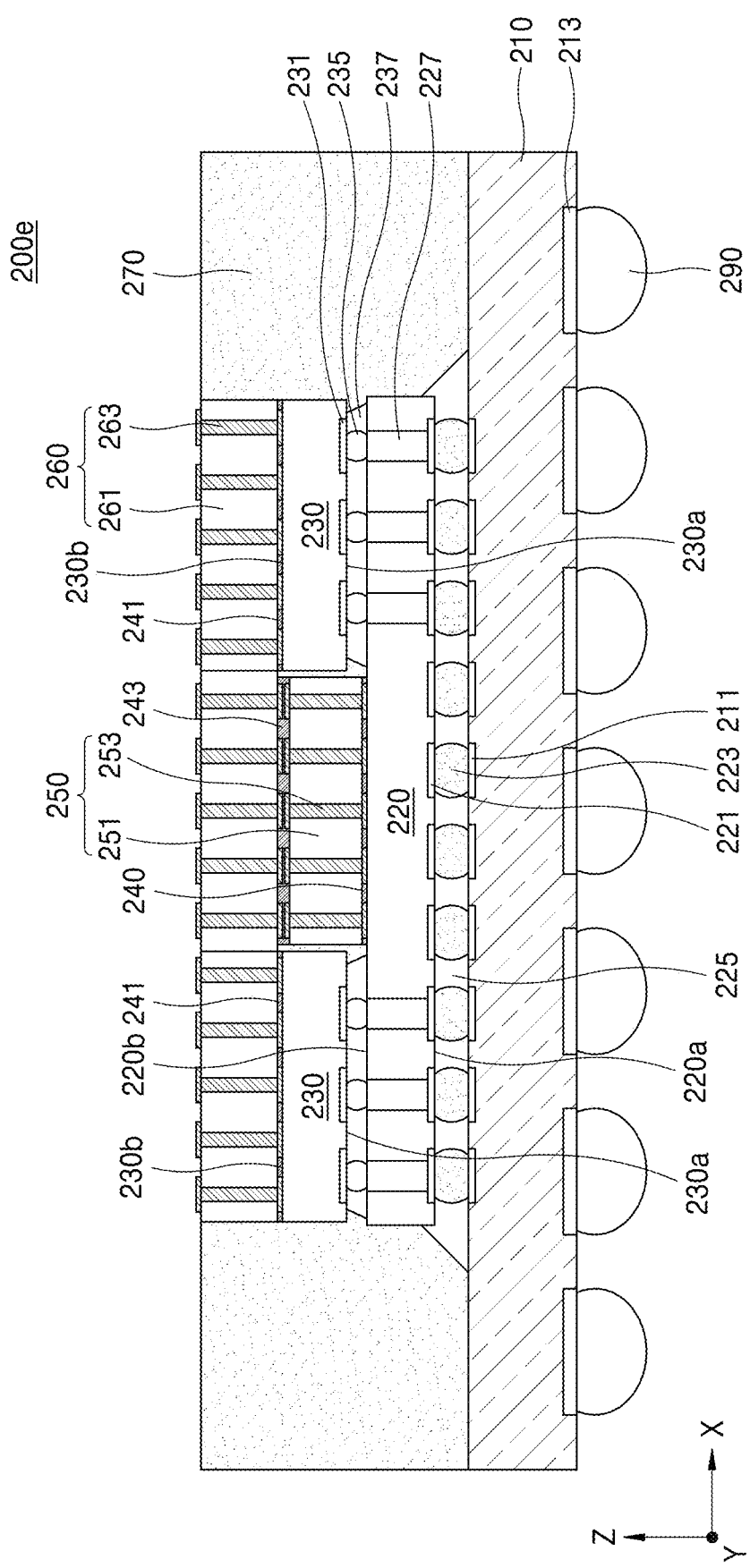

Referring to FIG. 13, a semiconductor package 200e may be substantially the same or substantially similar to the semiconductor package 200d shown in FIG. 12 except that the first interposer 250 and the second interposer 260 are stacked in the vertical direction.

For example, the semiconductor package 200e may include the first interposer 250 on the first semiconductor chip 220 and the second interposer 260 on the second semiconductor chip 230. The first interposer 250 and the second interposer 260 may be stacked in the vertical direction. The second interposer 260 may cover the second surface 230b of the second semiconductor chip 230 and an upper surface of the first interposer 250.

In this case, the second heat dissipation pattern 263 of the second interposer 260 and the first heat dissipation pattern 253 of the first interposer 250 may be aligned in the vertical direction. Thus, the heat of the first semiconductor chip 220 may be released to the outside through the first heat dissipation pattern 253 and the second heat dissipation pattern 263. Further, the third TIM 243 may be interposed between the first interposer 250 and the second interposer 260 to strengthen the thermal coupling between the first heat dissipation pattern 253 and the second heat dissipation pattern 263.

Figure 14:
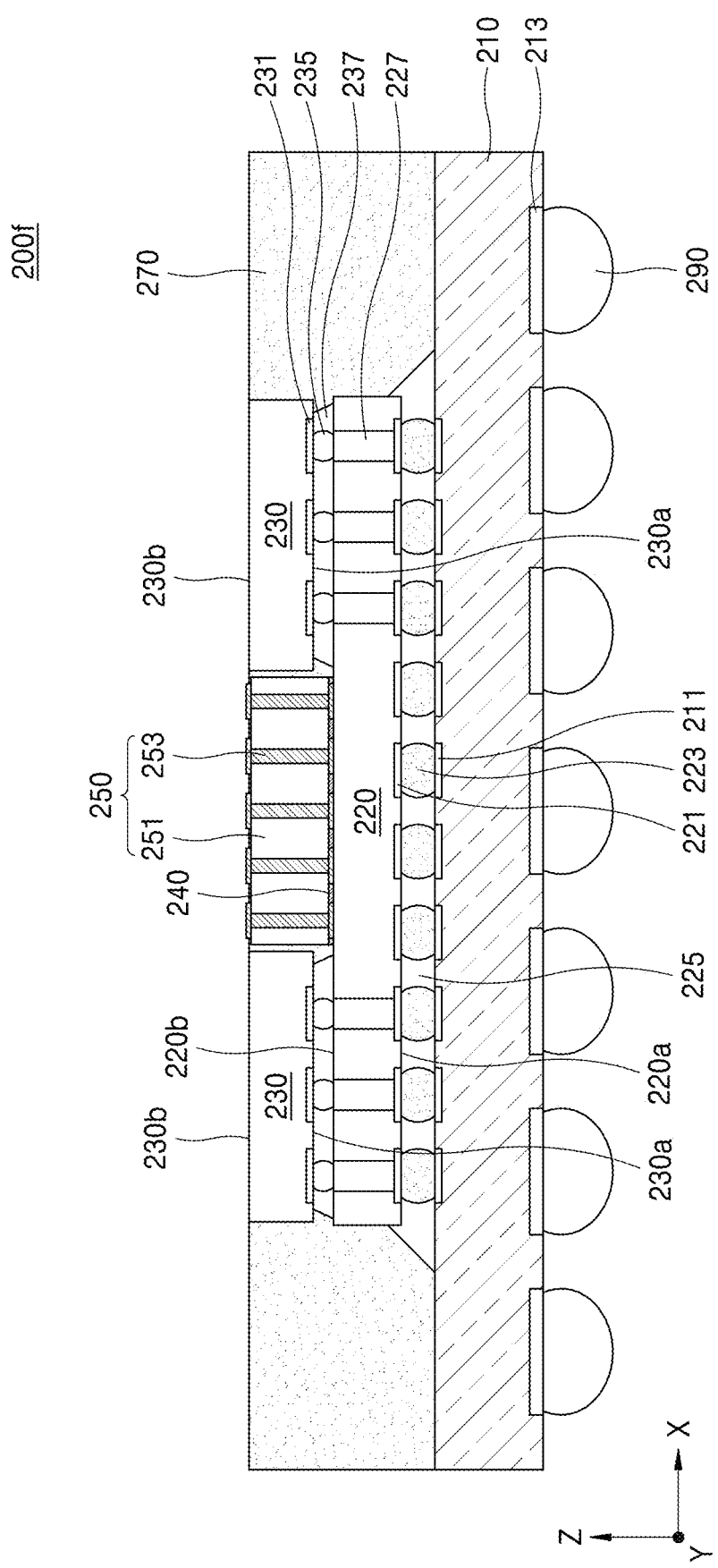

Referring to FIG. 14, a semiconductor package 200f may be substantially the same as or substantially similar to the semiconductor package 200d shown in FIG. 12 except that the second surface 230b of the second semiconductor chip 230 is exposed to the outside.

For example, the molding layer 270 may cover sidewalls of the second semiconductor chip 230 and may expose the second surface 230b of the second semiconductor chip 230. The heat of the second semiconductor chip 230 may be released to the outside through the exposed second surface 230b of the second semiconductor chip 230.

Figure 15:
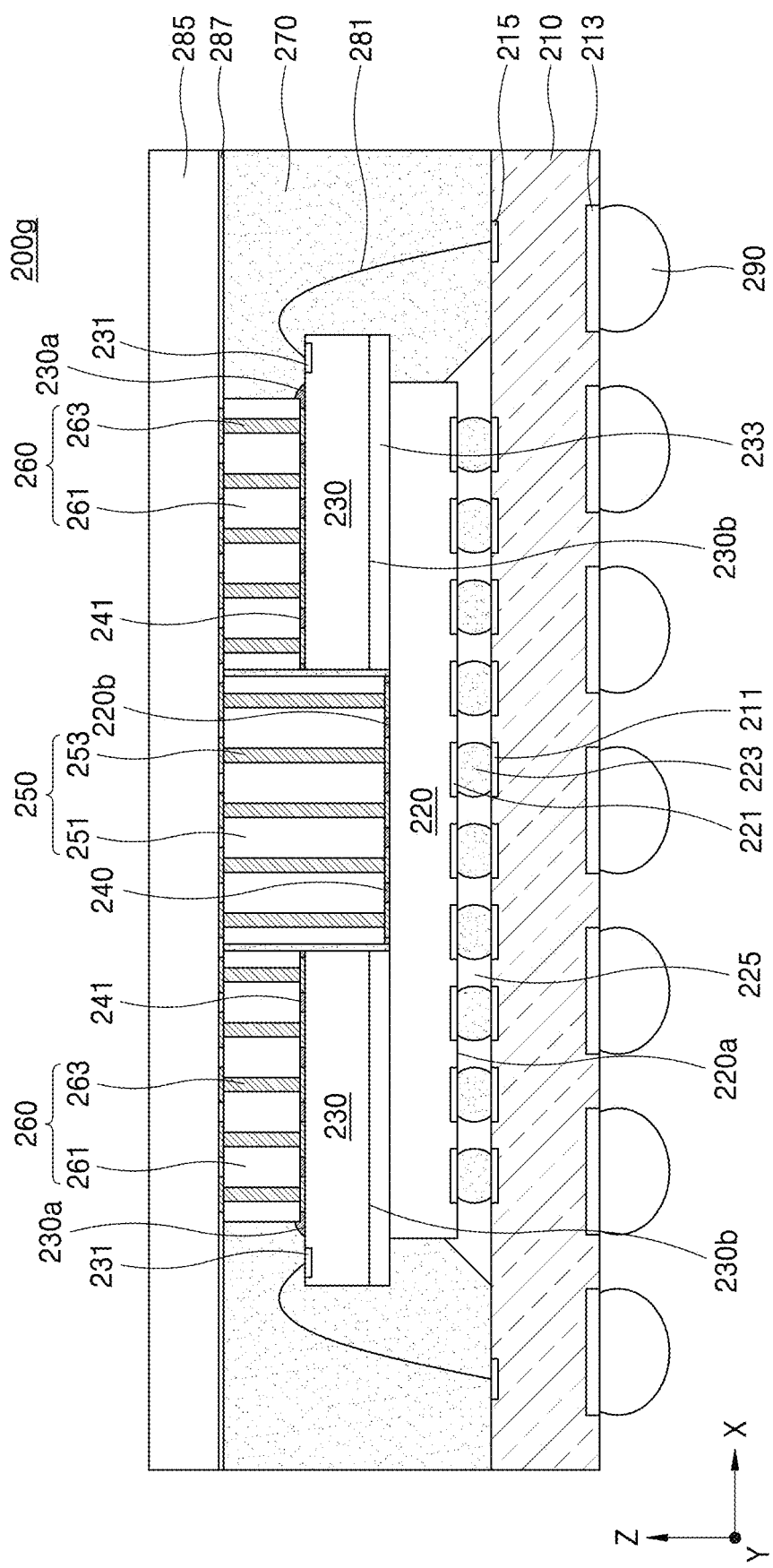

Referring to FIG. 15, a semiconductor package 200g may be substantially the same as or substantially similar to the semiconductor package 200b shown in FIG. 9 except further including a heat sink 285.

For example, the semiconductor package 200g may include the heat sink 285 on the first interposer 250 and/or the second interposer 260. The heat sink 285 may be thermally coupled to the first heat dissipation pattern 253 of the first interposer 250 and/or the second heat dissipation pattern 263 of the second interposer 260. For example, the heat sink 285 may be connected to the upper pad of the first heat dissipation pattern 253 and/or the upper pad of the second heat dissipation pattern 263.

In some example embodiments, a TIM 287 may be disposed between the first interposer 250 and the heat sink 285 and/or between the second interposer 260 and the heat sink 285. The TIM 287 may physically fix the heat sink 285 to the first interposer 250 and/or the second interposer 260 and may strengthen thermal coupling between the heat sink 285 and the first heat dissipation pattern 253 of the first interposer 250 and/or between the heat sink 285 and the second heat dissipation pattern 263 of the second interposer 260.

FIGS. 16, 17, 18, 19, and 20 are cross-sectional views illustrating semiconductor packages according to some example embodiments of the inventive concepts. Description of the same contents as described above are briefly made or omitted, for convenience of explanation.

Figure 16:
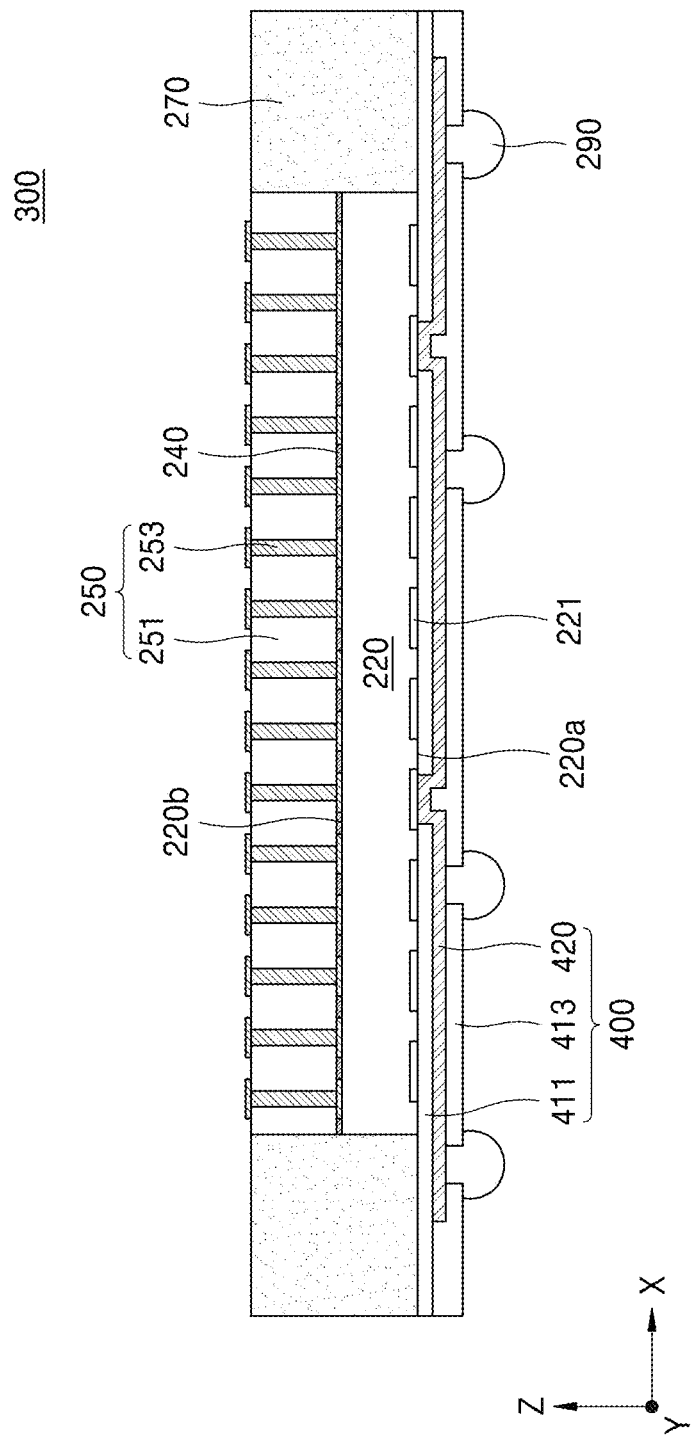
FIGS. 16, 17, 18, 19, and 20 are cross-sectional views illustrating semiconductor packages according to some example embodiments of the inventive concepts.

Referring to FIG. 16, a semiconductor package 300 may include the first semiconductor chip 220, the first interposer 250 on the first semiconductor chip 220, the molding layer 270 molding the first semiconductor chip 220 and the first interposer 250, and a redistribution structure 400.

The first semiconductor chip 220 may be disposed so that the first surface 220a of the first semiconductor chip 220 on which the first chip pad 221 is disposed faces downward. The redistribution structure 400 may be disposed on the first surface 220a of the first semiconductor chip 220. The first interposer 250 may be disposed on the second surface 220b of the first semiconductor chip 220.

The first interposer 250 may include the first interposer substrate 251 and the first heat dissipation pattern 253. A bottom of the first heat dissipation pattern 253 may contact the first semiconductor chip 220, and a top of the first heat dissipation pattern 253 may be exposed to the outside. The first TIM 240 may be disposed between the first interposer 250 and the first semiconductor chip 220 to strengthen the thermal coupling between the first heat dissipation pattern 253 and the first semiconductor chip 220.

The redistribution structure 400 may include a first insulation layer 411, a second insulation layer 413, and a redistribution pattern 420.

The first insulation layer 411 may be disposed on the first surface 220a of the first semiconductor chip 220 and a lower surface of the molding layer 270. The first insulation layer 411 may include an insulating material (e.g., oxide and/or nitride). The first insulation layer 411 may include an opening to expose the first chip pad 221 of the first semiconductor chip 220.

The redistribution pattern 420 may be disposed on the first insulation layer 411. A portion of the redistribution pattern 420 may extend along a surface of the first insulation layer 411, and the other portion of the redistribution pattern 420 may be electrically and physically connected to the first chip pad 221 of the first semiconductor chip 220 through the opening.

The second insulation layer 413 may be disposed on the first insulation layer 411 and the redistribution pattern 420. The second insulation layer 413 may include an insulating material (e.g., oxide and/or nitride). The second insulation layer 413 may include an opening to expose a portion of the redistribution pattern 420. The external connection terminal 290 may be disposed on a portion of the redistribution pattern 420 exposed through the opening.

Figure 17:
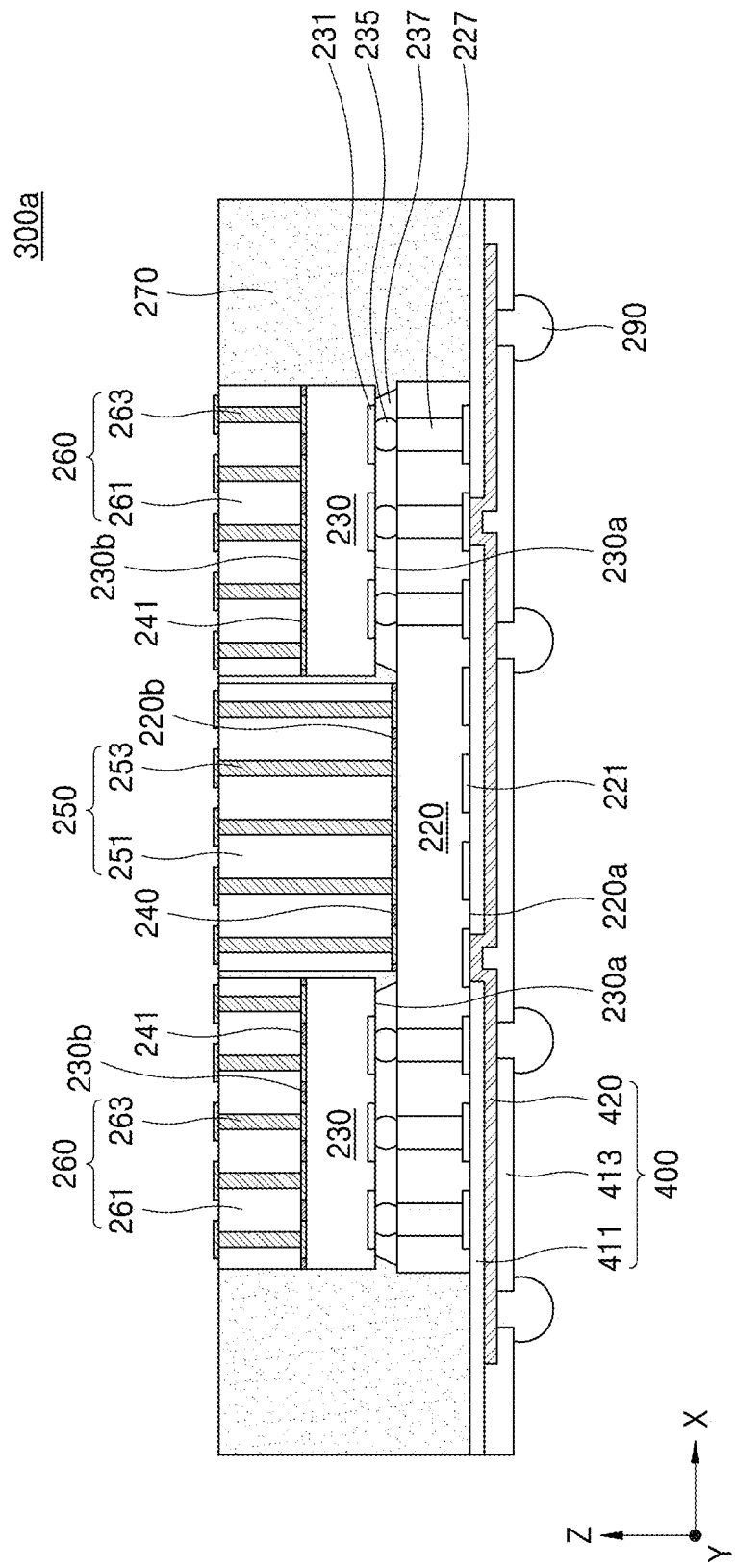

Referring to FIG. 17, a semiconductor package 300a may be substantially the same as or substantially similar to the semiconductor package 300 shown in FIG. 16 except further including the second semiconductor chip 230 on the first semiconductor chip 220 and the second interposer 260 on the second semiconductor chip 230.

For example, the second semiconductor chip 230 may be mounted on the first semiconductor chip 220 through the inter-chip connection 235. The second semiconductor chip 230 may be electrically connected to the first semiconductor chip 220 through the inter-chip connection 235 and the TSV 227 of the first semiconductor chip 220. Further, the second semiconductor chip 230 may be electrically connected to the redistribution pattern 420 of the redistribution structure 400 through the inter-chip connection 235 and the TSV 227 of the first semiconductor chip 220.

The second interposer 260 may be disposed on the second surface 230b of the second semiconductor chip 230, and may include the second interposer substrate 261 and the second heat dissipation pattern 263. The second TIM 241 may be disposed between the second interposer 260 and the second semiconductor chip 230 to strengthen the thermal coupling between the second heat dissipation pattern 263 and the second semiconductor chip 230.

The second semiconductor chip 230 may be disposed so that the first surface 230a of the second semiconductor chip 230 on which the second chip pad 231 is disposed faces the first semiconductor chip 220. The second interposer 260 may be disposed on the second surface 230b of the second semiconductor chip 230. Because the second chip pad 231 is not disposed on the second surface 230b of the second semiconductor chip 230, the second interposer 260 may cover the whole second surface 230b of the second semiconductor chip 230.

Figure 18:
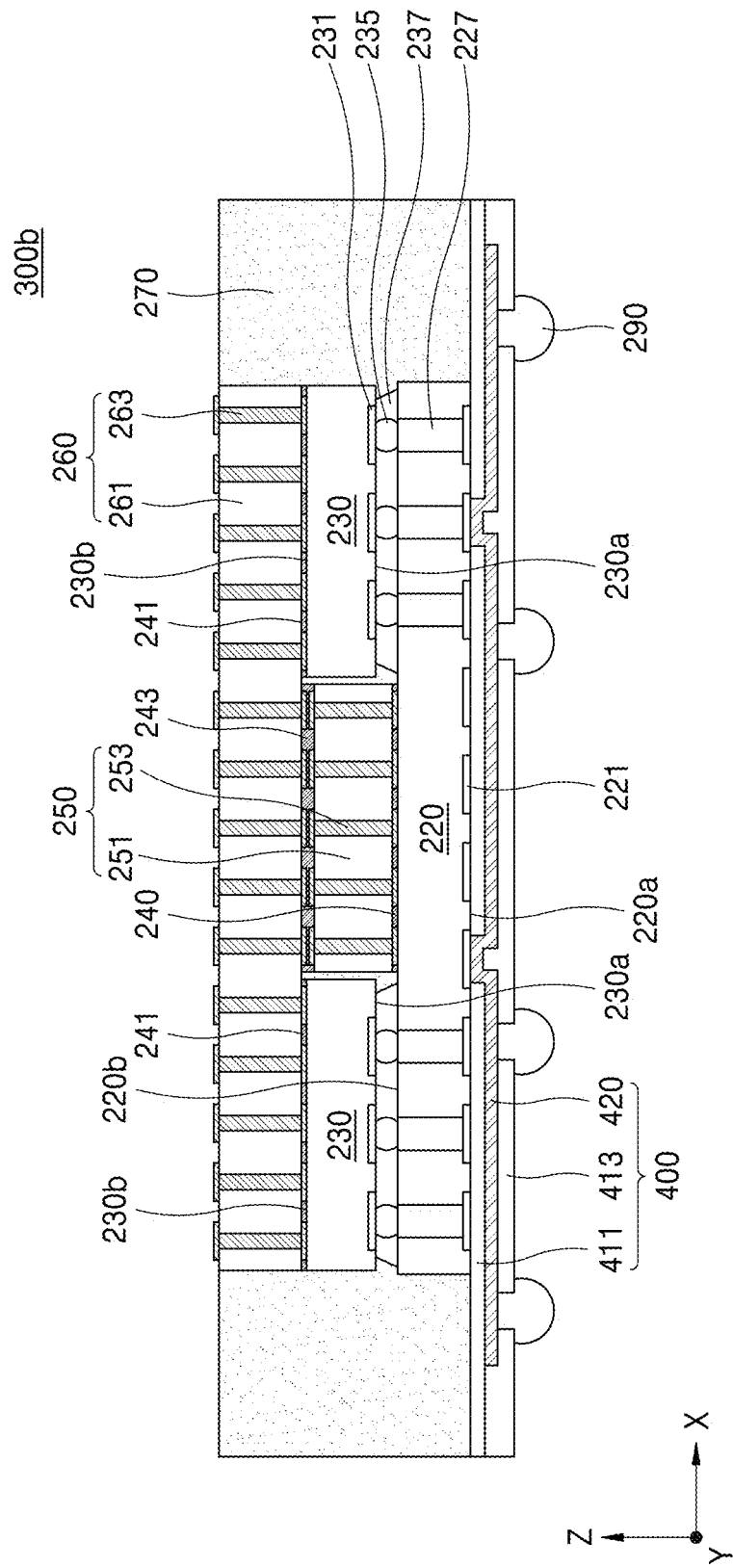

Referring to FIG. 18, a semiconductor package 300b may be substantially the same as or substantially similar to the semiconductor package 300a shown in FIG. 17 except that the first interposer 250 and the second interposer 260 are stacked in the vertical direction.

For example, the semiconductor package 300b may include the first interposer 250 on the first semiconductor chip 220 and the second interposer 260 on the second semiconductor chip 230. The first interposer 250 and the second interposer 260 may be stacked in the vertical direction. The second interposer 260 may cover the second surface 230b of the second semiconductor chip 230 and an upper surface of the first interposer 250.

In this case, the second heat dissipation pattern 263 of the second interposer 260 and the first heat dissipation pattern 253 of the first interposer 250 may be aligned in the vertical direction. Thus, the heat of the first semiconductor chip 220 may be released to the outside through the first heat dissipation pattern 253 of the first interposer 250 and the second heat dissipation pattern 263 of the second interposer 260. Further, the third TIM 243 may be disposed between the first interposer 250 and the second interposer 260 to strengthen the thermal coupling between the first heat dissipation pattern 253 and the second heat dissipation pattern 263.

Figure 19:
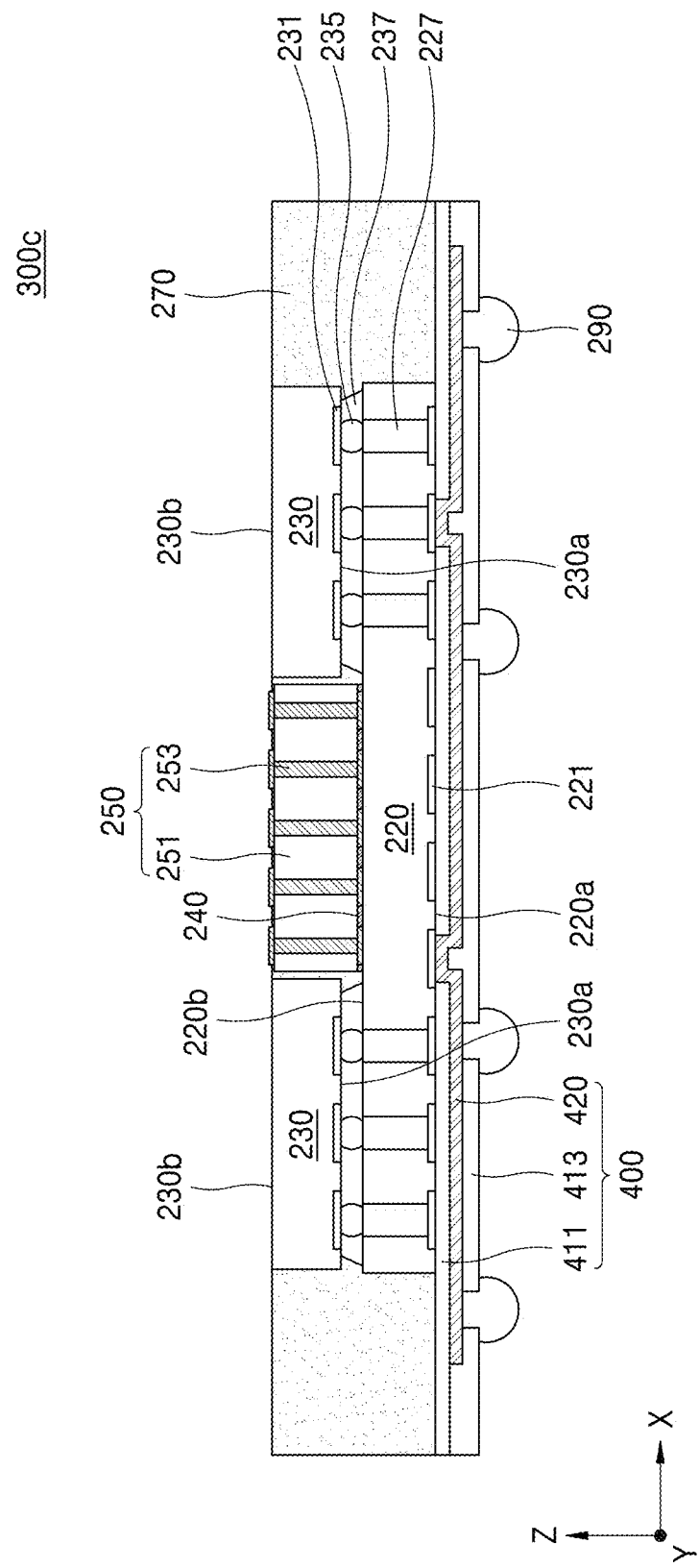

Referring to FIG. 19, a semiconductor package 300c may be the same as or substantially similar to the semiconductor package 300a shown in FIG. 17 except that the semiconductor package 300c does not include the second interposer (see 260 of FIG. 17) and the second surface 230b of the second semiconductor chip 230 is exposed to the outside.

For example, the molding layer 270 may cover sidewalls of the second semiconductor chip 230, and may expose the second surface 230b of the second semiconductor chip 230. The heat of the second semiconductor chip 230 may be released to the outside through the exposed second surface 230b of the second semiconductor chip 230.

Figure 20:
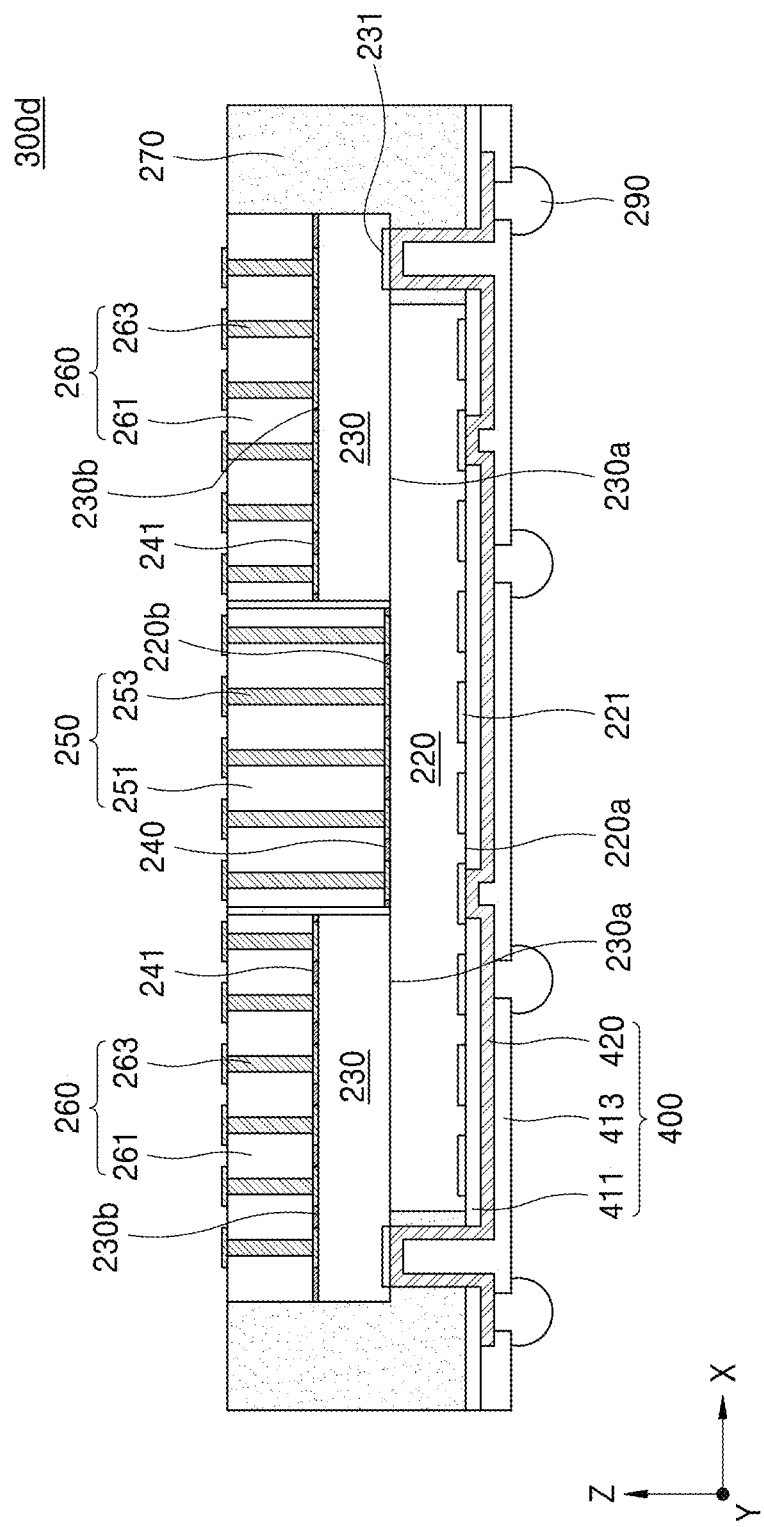

Referring to FIG. 20, a semiconductor package 300d may be substantially the same as or substantially similar to the semiconductor package 300a shown in FIG. 17 except that second semiconductor chip 230 is directly connected to the redistribution pattern 420.

Referring to FIG. 20, the second semiconductor chip 230 may be disposed in an offset relation on the first semiconductor chip 220. That is, a portion of the second semiconductor chip 230 protrudes from the first semiconductor chip 220 in the horizontal direction. The first surface 230a of the second semiconductor chip 230 on which the second chip pad 231 is disposed may contact the first semiconductor chip 220. The second chip pad 231 of the second semiconductor chip 230 may be laterally spaced apart from a sidewall of the first semiconductor chip 220. In this case, a portion of the redistribution pattern 420 may extend in the vertical direction through an opening of the molding layer 270 and may be physically and electrically connected to the second chip pad 231 of the second semiconductor chip 230.

Figure 21A:
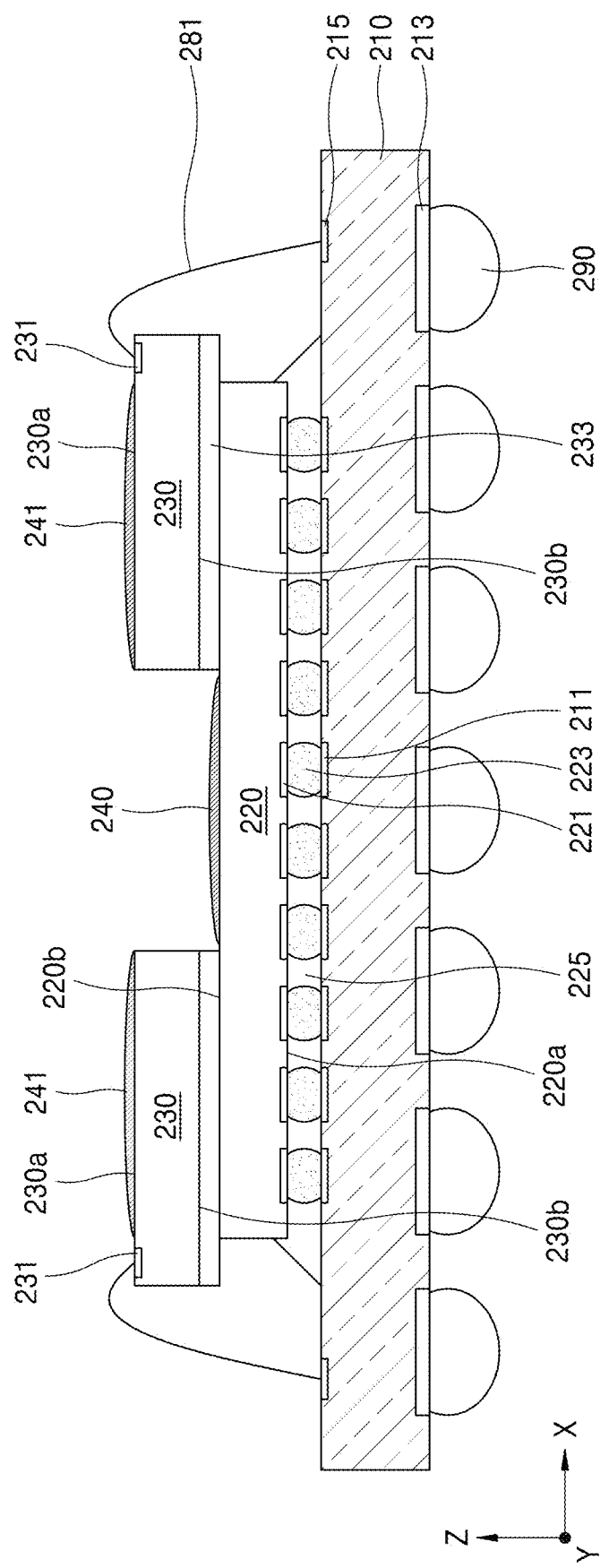
FIGS. 21A and 21B are cross-sectional views illustrating a method of manufacturing the semiconductor package of FIG. 9 according to an example embodiment of the inventive concepts.
Figure 21B:
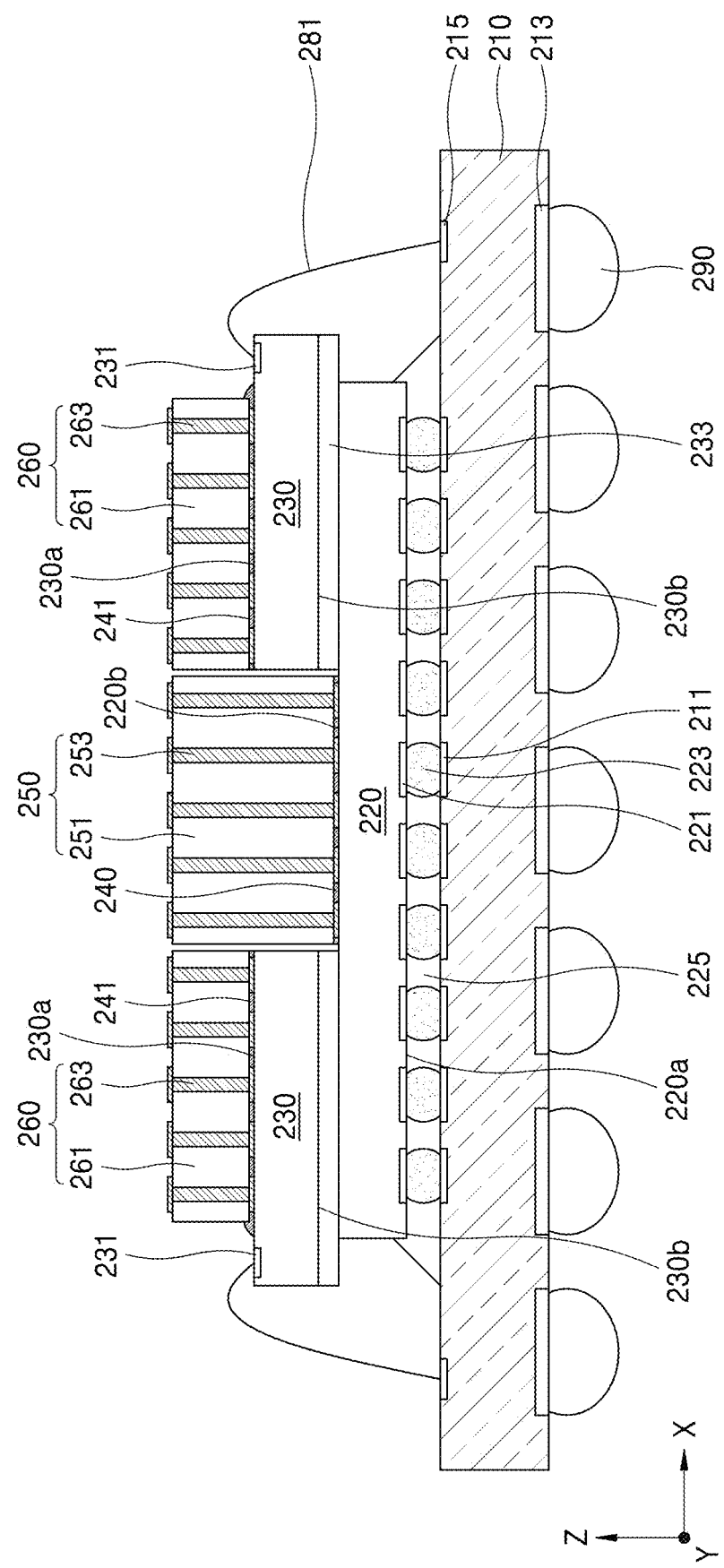

FIGS. 21A and 21B are cross-sectional views illustrating a method of manufacturing the semiconductor package of FIG. 9 according to an example embodiment of the inventive concepts. Descriptions of the same contents as described above are briefly made or omitted, for convenience of explanation.

Referring to FIG. 21A, the first semiconductor chip 220 may be positioned on the package substrate 210. The first semiconductor chip 220 may be mounted on the package substrate 210 by a flip chip bonding method. The first surface 220a of the first semiconductor chip 220 on which the first chip pad 221 is provided may face the package substrate 210. The second semiconductor chip 230 may be stacked on the first semiconductor chip 220 subsequent to mounting the first semiconductor chip 220 on the package substrate 210. The second semiconductor chip 230 may be offset from the first semiconductor chip 220. A portion of the second semiconductor chip 230 may protrude from the first semiconductor chip 220 in the horizontal direction. The second semiconductor chip 230 may be fixed to the first semiconductor chip 220 by the adhesive layer 233.

After the second semiconductor chip 230 is stacked, the conductive wire 281 may be formed to connect between the second chip pad 231 of the second semiconductor chip 230 and the upper substrate pad 215 of the package substrate 210 by a wire bonding process.

Thereafter, the first TIM 240 covering at least a portion of the first semiconductor chip 220 and the second TIM 241 covering at least a portion of the second semiconductor chip 230 may be formed. For example, the first TIM 240 and the second TIM 241 may be formed by applying a material having a high thermal conductivity onto the first semiconductor chip 220 and the second semiconductor chip 230 through a dispensing method (e.g., a spray coating method).

Referring to FIG. 21B, the first interposer 250 may be positioned on the first semiconductor chip 220, and the second interposer 260 may be positioned on the second semiconductor chip 230. In the state in which the first interposer 250 is positioned on the first TIM 240 and the second interposer 260 is positioned on the second TIM 241, the first TIM 240 and the second TIM 241 may be cured to fix the first interposer 250 and the second interposer 260 to the first semiconductor chip 220 and the second semiconductor chip 230, respectively.

Thereafter, the molding layer (see 270 of FIG. 9) may be formed to mold the first semiconductor chip 220, the second semiconductor chip 230, the first interposer 250, and the second interposer 260. The molding layer (see 270 of FIG. 9) may be formed to expose a top of the first heat dissipation pattern 253 of the first interposer 250 and a top of the second heat dissipation pattern 263 of the second interposer 260 to the outside. The molding layer (see 270 of FIG. 9) may be formed by the method the same as or substantially similar to that described with reference to FIGS. 6, 7A and 7B.

After the molding layer 270 is formed, the individualized semiconductor package 200a shown in FIG. 9 may be completed by a singulation process.

FIGS. 22A, 22B, 22C, and 22D are cross-sectional views illustrating a method of manufacturing the semiconductor package of FIG. 17 according to an example embodiment of the inventive concepts. Descriptions of the same contents as described above are briefly made or omitted, for convenience of explanation.

Figure 22A:
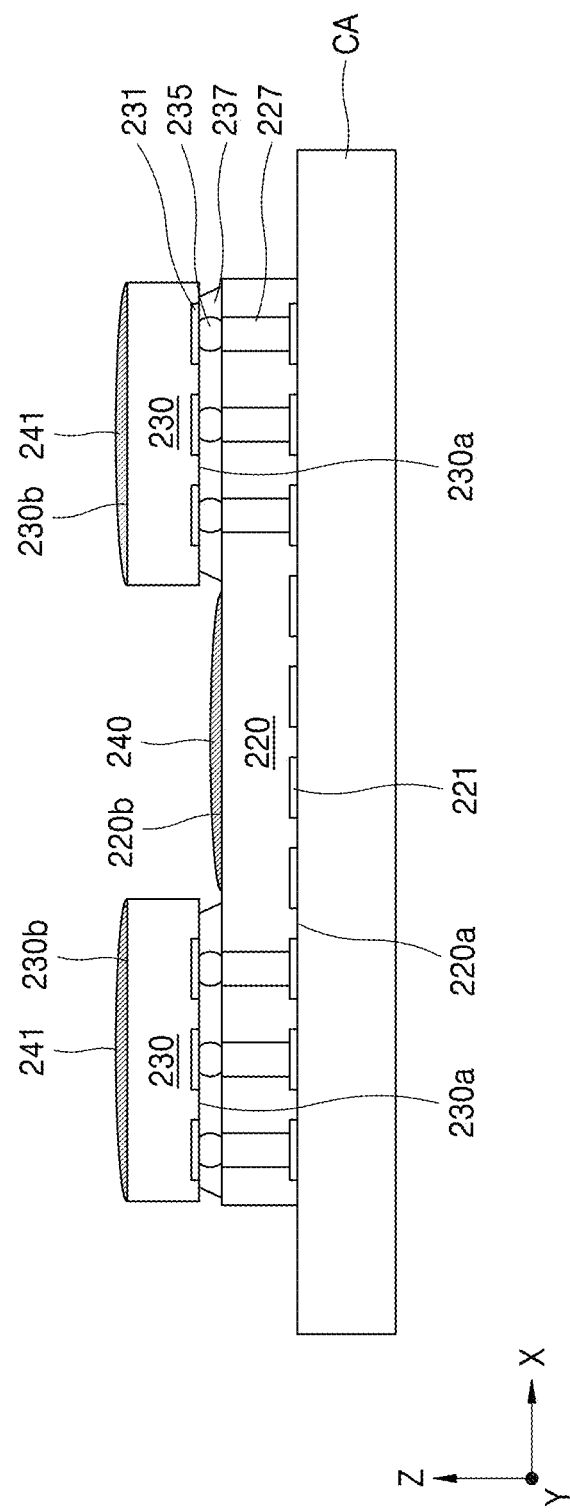
FIGS. 22A, 22B, 22C, and 22D are cross-sectional views illustrating a method of manufacturing the semiconductor package of FIG. 17 according to an example embodiment of the inventive concepts.

Referring to FIG. 22A, the first semiconductor chip 220 may be provided on a carrier CA so that the first surface 220a of the first semiconductor chip 220 on which the first chip pad 221 is formed contacts the carrier CA.

The second semiconductor chip 230 may be stacked on the first semiconductor chip 220 by a flip chip bonding method after the first semiconductor chip 220 is provided on the carrier CA. In this case, the first surface 230a of the second semiconductor chip 230 on which the second chip pad 231 is formed faces the first semiconductor chip 220.

After stacking the second semiconductor chip 230, the first TIM 240 covering at least a portion of the first semiconductor chip 220 and the second TIM 241 covering at least a portion of the second semiconductor chip 230 may be formed. For example, the first TIM 240 and the second TIM 241 may be formed by applying a material having a high thermal conductivity onto the first semiconductor chip 220 and the second semiconductor chip 230 through a dispensing method (e.g., a spray coating method).

Figure 22B:
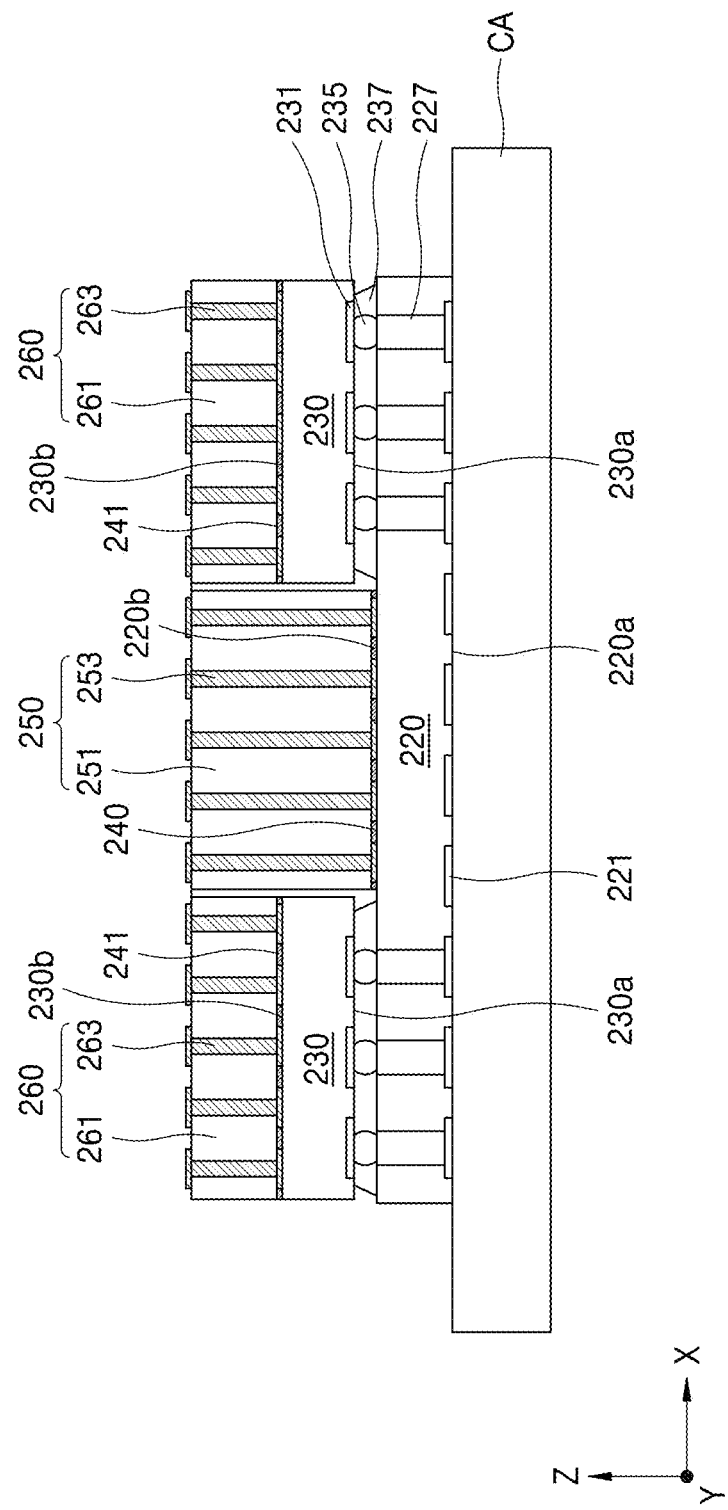

Referring to FIG. 22B, the first interposer 250 may be positioned on the first semiconductor chip 220, and the second interposer 260 may be positioned on the second semiconductor chip 230. In the state in which the first interposer 250 is positioned on the first TIM 240 and the second interposer 260 is positioned on the second TIM 241, the first TIM 240 and the second TIM 241 may be cured to fix the first interposer 250 and the second interposer 260 to the first semiconductor chip 220 and the second semiconductor chip 230, respectively.

Figure 22C:
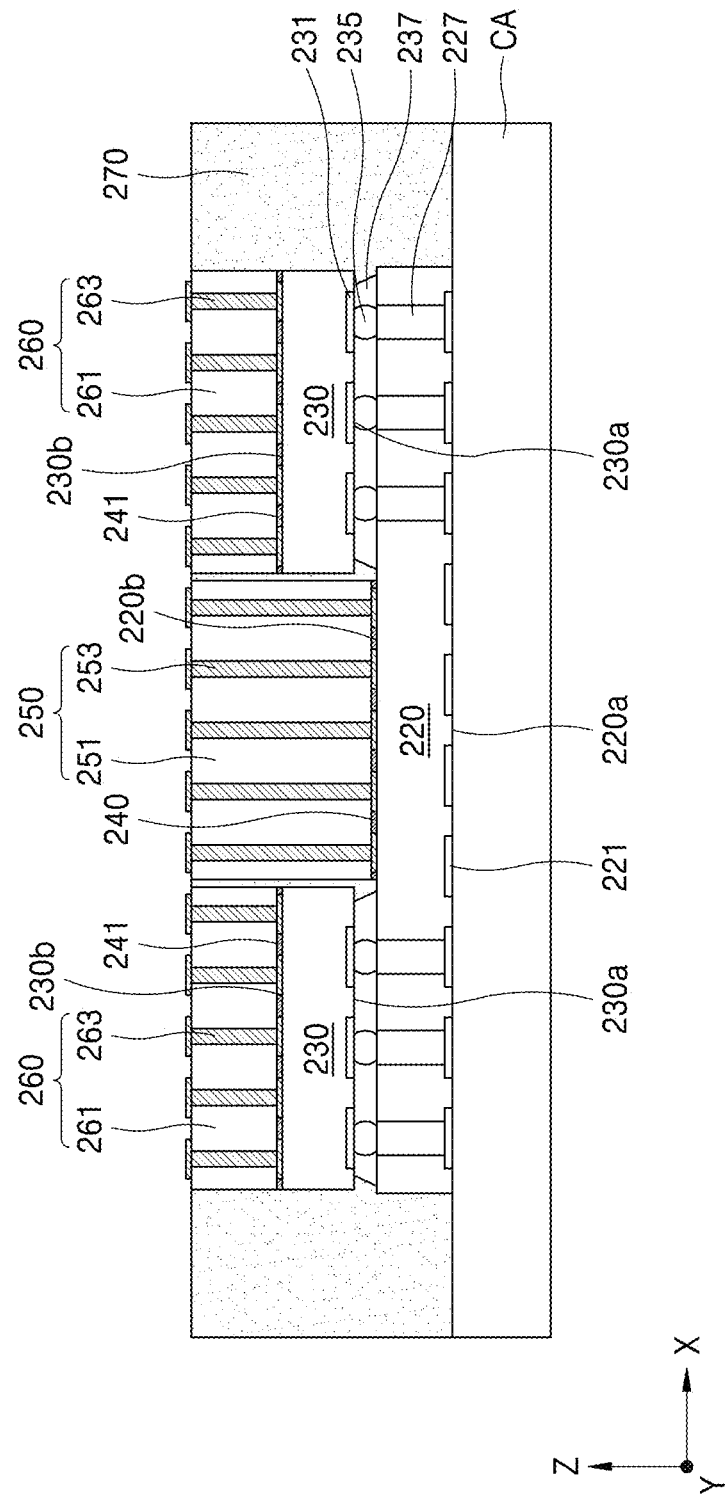

Referring to FIG. 22C, the molding layer 270 may be formed to mold the first semiconductor chip 220, the second semiconductor chip 230, the first interposer 250, and the second interposer 260. The molding layer 270 may be formed to expose a top of the first heat dissipation pattern 253 of the first interposer 250 and a top of the second heat dissipation pattern 263 of the second interposer 260 to the outside. The molding layer 270 may be formed by the method the same as or substantially similar to that described with reference to FIGS. 6, 7A and 7B.

Figure 22D:
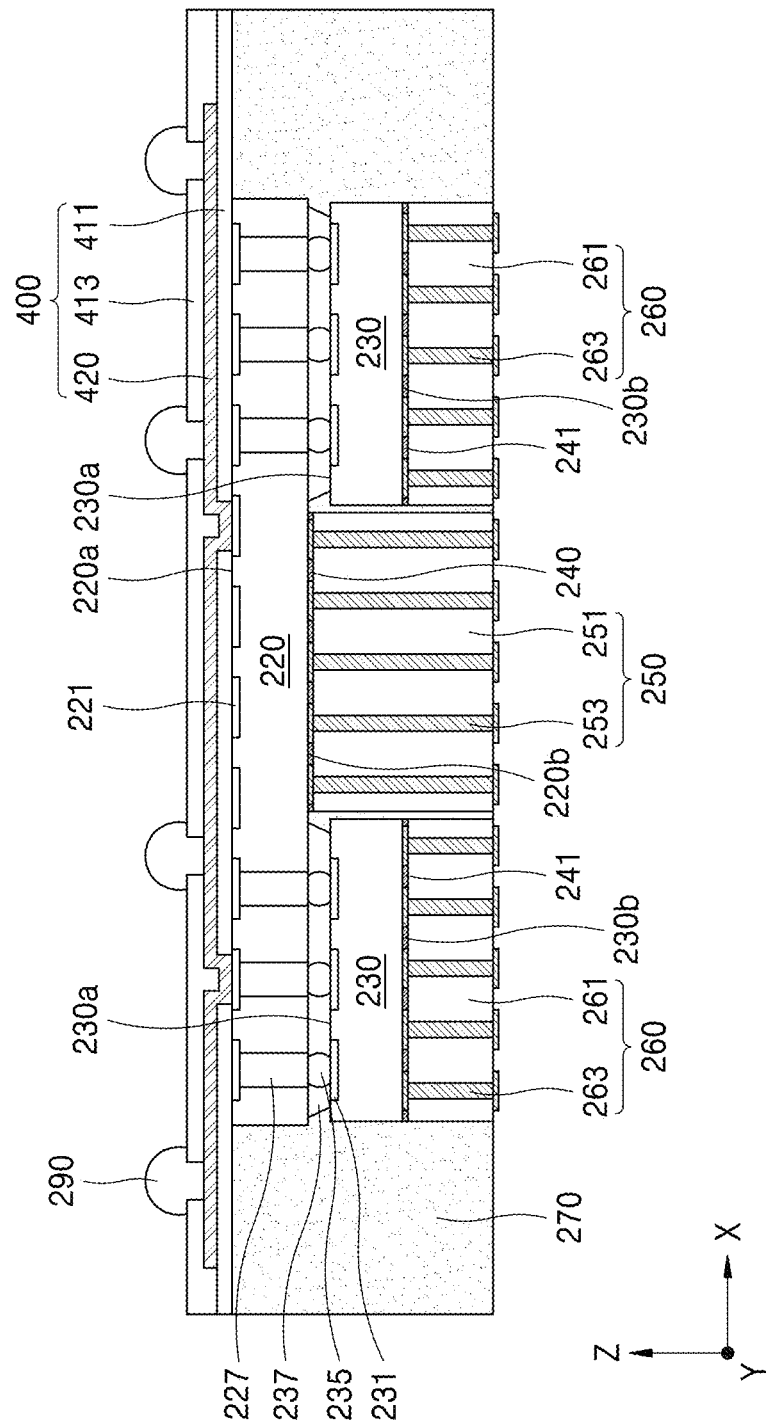

Referring to FIG. 22D, after the molding layer 270 is formed, the resulting structure of FIG. 22C may be separated from the carrier CA of FIG. 22C. Thereafter, the redistribution structure 400 may be formed on a surface of the molding layer 270 and the first surface 220a of the first semiconductor chip 220 on which the first chip pad 221 is formed.

For example, the first insulation layer 411 may be formed on the surface of the molding layer 270 and the first surface 220a of the first semiconductor chip 220. To form the first insulation layer 411, an insulation layer may be formed to cover the surface of the molding layer 270 and the first surface 220a of the first semiconductor chip 220, and then a portion of the insulation layer may be removed to form an opening to expose the first chip pad 221 of the first semiconductor chip 220.

Thereafter, the redistribution pattern 420 may be formed on the first insulation layer 411. A portion of the redistribution pattern 420 may be connected to the first chip pad 221 through the opening of the first insulation layer 411. To form the redistribution pattern 420, a conductive layer may be formed on the first insulation layer 411 and the first chip pad 221, and then the conductive layer may be patterned.

The second insulation layer 413 may be formed on the first insulation layer 411 and the redistribution pattern 420. To form the second insulation layer 413, an insulation layer may be formed to cover the first insulation layer 411 and the redistribution pattern 420, and then a portion of the insulation layer may be removed to form the opening to expose a portion of the redistribution pattern 420.

The external connection terminal 290 may be formed on the portion of the redistribution pattern 420 exposed through the opening of the second insulation layer 413. The external connection terminal 290 may be, for example, a solder ball or a bump. After the external connection terminal 290 is formed, the individualized semiconductor package 300a shown in FIG. 17 may be completed by a singulation process.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
  a first semiconductor chip;
  a first interposer on the first semiconductor chip, the first interposer including a first interposer substrate and a plurality of first heat dissipation patterns, penetrating the first interposer substrate, each of the first heat dissipation patterns not being electrically connected to and being in direct contact with the first semiconductor chip; and
  a molding layer being in contact with both at least a portion of a side surface of the first semiconductor chip and at least a portion of a side surface of the first interposer substrate, the molding layer extending along the side surface of the first interposer substrate,
  wherein the first heat dissipation patterns include,
    first through electrodes completely penetrating the first interposer substrate, upper surfaces of the first through electrodes being coplanar with an upper surface of the first interposer substrate,
    first upper pads on the upper surface of the first interposer substrate and connected to the first through electrodes, and
    first lower pads connected to the first through electrodes and spaced apart from each other, the first lower pads contacting a lower surface of the first interposer substrate, the lower surface of the first interposer substrate being coplanar with lower surfaces of the first through electrodes,
  wherein the molding layer contacts sidewalls of the first upper pads and the upper surface of the first interposer substrate, and
  wherein upper surfaces of the first upper pads are not covered by the molding layer.

2. The semiconductor package according to claim 1, wherein a width of each of the first upper pads in a horizontal direction is greater than a width of each of the first through electrodes in the horizontal direction.

3. The semiconductor package according to claim 1, wherein
  the first heat dissipation patterns further include upper cover layers covering the first upper pads, each of the upper cover layers conformally covers a corresponding one of the first upper pads along a contour defined by an upper surface of the corresponding one of the first upper pads and side surfaces of the corresponding one of the first upper pads, and the upper cover layers include at least one of nickel and gold.

4. The semiconductor package according to claim 1, wherein a width of each of the first lower pads in a horizontal direction is greater than a width of each of the first through electrodes in the horizontal direction.

5. The semiconductor package according to claim 1, further comprising:
a first thermal interface material between the first interposer and the first semiconductor chip and covering sidewalls of the first lower pads.

6. The semiconductor package according to claim 1, wherein the first heat dissipation patterns further includes lower cover layers covering the first lower pads.

7. The semiconductor package according to claim 1, further comprising:
a second semiconductor chip on the first semiconductor chip; and
a second interposer on the second semiconductor chip, the second interposer including a second interposer substrate and a second heat dissipation pattern penetrating the second interposer substrate,
wherein the second heat dissipation pattern is electrically insulated from the second semiconductor chip, and
a top of the second heat dissipation pattern protrudes above the second interposer substrate.

8. The semiconductor package according to claim 7, wherein the first interposer includes a protruded portion surrounding sidewalls of the second semiconductor chip.

9. The semiconductor package according to claim 7, wherein
the first interposer further includes a plurality of third heat dissipation patterns,
the second interposer includes a plurality of second heat dissipation patterns, the plurality of second heat dissipation patterns including the second heat dissipation pattern, and
a density of the plurality of third heat dissipation patterns is different from a density of the plurality of second heat dissipation patterns.

10. The semiconductor package according to claim 1, wherein the first interposer includes a first sub interposer and a second sub interposer that are spaced apart from each other.

11. The semiconductor package according to claim 1, further comprising:
a second semiconductor chip on the first semiconductor chip,
wherein a first surface of the second semiconductor chip on which a chip pad is disposed faces the first semiconductor chip, and
the second semiconductor chip is electrically connected to the first semiconductor chip through a through silicon via that penetrates the first semiconductor chip.

12. The semiconductor package according to claim 1, wherein the first interposer substrate includes an organic material.

13. A semiconductor package comprising:
a first semiconductor chip;
a second semiconductor chip on the first semiconductor chip;
a first interposer on the first semiconductor chip, the first interposer including a first interposer substrate and a plurality of first heat dissipation patterns completely penetrating the first interposer substrate, each of the first heat dissipation patterns not being electrically connected to and being in direct contact with the first semiconductor chip;
a second interposer on the second semiconductor chip, the second interposer including a second interposer substrate and a second heat dissipation pattern penetrating the second interposer substrate, the second heat dissipation pattern not being not electrically connected to and being in direct contact with the second semiconductor chip; and
a molding layer being in contact with the second semiconductor chip, the first interposer, and the second interposer,
wherein the first heat dissipation patterns include,
first through electrodes completely penetrating the first interposer substrate, upper surfaces of the first through electrodes being coplanar with set upper surface of the first interposer substrate,
first upper pads on the upper surface of the first interposer substrate and connected to the first through electrodes, and
first lower pads connected to the first through electrodes and spaced apart from each other, the first lower pads contacting a lower surface of the first interposer substrate, the lower surface of the first interposer substrate being coplanar with lower surfaces of the first through electrodes, and
wherein the molding layer contacts sidewalls of the first upper pads and the upper surface of the first interposer substrate.

14. The semiconductor package according to claim 13, wherein
bottom surfaces of the first heat dissipation patterns contact the first semiconductor chip,
top surfaces of the first heat dissipation patterns protrude above the first interposer substrate,
a bottom surface of the second heat dissipation pattern contacts the second semiconductor chip, and
a top surface of the second heat dissipation pattern protrudes above the second interposer substrate.

15. The semiconductor package according to claim 13, further comprising:
the second heat dissipation pattern includes a second upper pad on an upper surface of the second interposer substrate, and
the molding layer covers at least a portion of a sidewall of the second upper pad.

16. The semiconductor package according to claim 13, further comprising:
a first thermal interface material between the first semiconductor chip and the first interposer; and
a second thermal interface material between the second semiconductor chip and the second interposer,
wherein the second heat dissipation pattern includes a second lower pad on a lower surface of the second interposer substrate,
the first thermal interface material covers at least a portion of the first lower pads, and
the second thermal interface material covers at least a portion of the second lower pad.

17. The semiconductor package according to claim 13, wherein the second interposer is on the first interposer such that the second heat dissipation pattern of the second interposer is aligned with a corresponding one of the first heat dissipation patterns of the first interposer in a vertical direction.

18. The semiconductor package according to claim 13, further comprising:
  a package substrate on which the first semiconductor chip is mounted,
  wherein a portion of the second semiconductor chip protrudes laterally from the first semiconductor chip, and
  the second semiconductor chip is electrically connected to the package substrate through a conductive wire.

19. A semiconductor package comprising:
  a first semiconductor chip;
  a second semiconductor chip on the first semiconductor chip;
  a third semiconductor chip on the first semiconductor chip;
  a first interposer on the first semiconductor chip, the first interposer including a first interposer substrate and a plurality of first heat dissipation patterns, each of the first heat dissipation patterns completely penetrating the first interposer substrate, each of the first heat dissipation patterns not being electrically connected to and being in direct contact with the first semiconductor chip;
  a second interposer on the second semiconductor chip, the second interposer including a second interposer substrate and a plurality of second heat dissipation patterns, the second heat dissipation patterns being not electrically conductive and being in direct contact with the second semiconductor chip;
  a third interposer on the third semiconductor chip, the third interposer including a third interposer substrate and a plurality of third heat dissipation patterns, the third heat dissipation patterns being not electrically conductive and being in direct contact with the third semiconductor chip; and
  a molding layer covering and being in contact with at least a portion of the first semiconductor chip, at least a portion of the first interposer, at least a portion of the second semiconductor chip, at least a portion of the second interposer, at least a portion of the third semiconductor chip, and at least a portion of the third interposer,
  wherein each of the plurality of first heat dissipation patterns includes a first through electrode completely penetrating the first interposer substrate, a first upper pad on an upper surface of the first interposer substrate and connected to the first through electrode, and a first lower pad on a lower surface of the first interposer substrate and connected to the first through electrode, an upper surface of the first through electrode being coplanar with the upper surface of the first interposer substrate, a lower surface of the first through electrode being coplanar with the lower surface of the first interposer substrate,
  each of the plurality of second heat dissipation patterns includes a second through electrode passing through the second interposer substrate, and a second upper pad on an upper surface of the second interposer substrate and connected to the second through electrode, and
  each of the plurality of third heat dissipation patterns includes a third through electrode passing through the third interposer substrate, and a third upper pad on an upper surface of the third interposer substrate and connected to the third through electrode.

* * * * *